(12) United States Patent
Kuwabara

(10) Patent No.: US 8,119,188 B2
(45) Date of Patent: Feb. 21, 2012

(54) PROCESS OF MANUFACTURING LUMINESCENT DEVICE

(75) Inventor: Hideaki Kuwabara, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/478,968

(22) Filed: Jun. 5, 2009

(65) Prior Publication Data

US 2009/0274831 A1  Nov. 5, 2009

Related U.S. Application Data

(62) Division of application No. 10/160,113, filed on Jun. 4, 2002, now abandoned.

(30) Foreign Application Priority Data

Jun. 8, 2001 (JP) .................................. 2001-174498

(51) Int. Cl.
  B05D 5/06 (2006.01)
  B05D 3/02 (2006.01)
  B05D 1/02 (2006.01)
(52) U.S. Cl. ........................ 427/66; 427/384; 427/422
(58) Field of Classification Search ................ 427/66, 427/422, 384
  See application file for complete search history.

(56) References Cited

U.S. PATENT DOCUMENTS

| 4,617,195 A | 10/1986 | Mental |
| 5,405,724 A | 4/1995 | Hsieh et al. |
| 5,536,949 A * | 7/1996 | Hosokawa et al. ............. 257/40 |
| 5,543,177 A | 8/1996 | Morrison et al. |
| 5,585,213 A | 12/1996 | Tamano et al. |
| 5,650,197 A | 7/1997 | Halpern |
| 5,698,740 A | 12/1997 | Enokida et al. |
| 5,703,436 A | 12/1997 | Forrest et al. |
| 5,770,272 A * | 6/1998 | Biemann et al. ............. 427/162 |
| 5,821,002 A | 10/1998 | Ohnishi et al. |
| 5,843,527 A | 12/1998 | Sanada |
| 5,851,274 A | 12/1998 | Lin |
| 5,891,587 A | 4/1999 | Hu et al. |
| 5,895,692 A | 4/1999 | Shirasaki et al. |
| 5,895,717 A | 4/1999 | Cao et al. |
| 5,903,101 A | 5/1999 | Kijima |

(Continued)

FOREIGN PATENT DOCUMENTS

EP  0 892 028  1/1999

(Continued)

*Primary Examiner* — James Lin
(74) *Attorney, Agent, or Firm* — Eric J. Robinson; Robinson Intellectual Property Law Office, P.C.

(57) ABSTRACT

A method of forming a film consisted of an organic compound material at low cost using an organic compound material having the high luminescence efficiency is provided. The present invention is characterized by the fact that a layer containing an organic compound is formed on the substrate under the inactive gas atmosphere by spreading the colloidal solution (referred to as sol) in which an aggregate of organic compound is dispersed. Noted that in the present invention, an organic compound may be particulate that several pieces of organic compound is aggregated in the liquid, or may be an organic compound partially dissolved in the liquid. Moreover, according to the present invention, a metal thin film is formed using the colloidal solution in which a metal material having a small work function is dispersed on the layer containing an organic compound by a coat method and made it a cathode or one portion of a cathode.

36 Claims, 11 Drawing Sheets

U.S. PATENT DOCUMENTS

| | | | |
|---|---|---|---|
| 5,921,836 A | 7/1999 | Nanto et al. | |
| 5,948,552 A | 9/1999 | Antoniadis et al. | |
| 5,968,675 A | 10/1999 | Tamano et al. | |
| 6,013,982 A | 1/2000 | Thompson et al. | |
| 6,049,167 A | 4/2000 | Onitsuka et al. | |
| 6,066,712 A | 5/2000 | Ueda et al. | |
| 6,114,088 A | 9/2000 | Wolk et al. | |
| 6,140,009 A | 10/2000 | Wolk et al. | |
| 6,160,346 A | 12/2000 | Vleggaar et al. | |
| 6,168,731 B1 | 1/2001 | Hampden-Smith et al. | |
| 6,171,765 B1 | 1/2001 | Sheats | |
| 6,174,613 B1 | 1/2001 | Antoniadis et al. | |
| 6,194,119 B1 | 2/2001 | Wolk et al. | |
| 6,197,365 B1 | 3/2001 | Bachinger et al. | |
| 6,207,301 B1 | 3/2001 | Ohnishi et al. | |
| 6,214,520 B1 | 4/2001 | Wolk et al. | |
| 6,214,631 B1 | 4/2001 | Burrows et al. | |
| 6,215,462 B1 | 4/2001 | Yamada et al. | |
| 6,221,553 B1 | 4/2001 | Wolk et al. | |
| 6,228,555 B1 | 5/2001 | Hoffend, Jr. et al. | |
| 6,242,152 B1 | 6/2001 | Staral et al. | |
| 6,245,393 B1 | 6/2001 | Thompson et al. | |
| 6,258,954 B1 | 7/2001 | Kunimoto et al. | |
| 6,259,202 B1 | 7/2001 | Sturm et al. | |
| 6,264,805 B1 | 7/2001 | Forrest et al. | |
| 6,270,944 B1 | 8/2001 | Wolk et al. | |
| 6,281,552 B1 | 8/2001 | Kawasaki et al. | |
| 6,284,425 B1 | 9/2001 | Staral et al. | |
| 6,288,487 B1 * | 9/2001 | Arai | 313/506 |
| 6,291,116 B1 | 9/2001 | Wolk et al. | |
| 6,291,126 B2 | 9/2001 | Wolk et al. | |
| 6,306,559 B1 | 10/2001 | Tanamura et al. | |
| 6,310,231 B1 | 10/2001 | Igarashi et al. | |
| 6,312,837 B1 | 11/2001 | Kijima | |
| 6,319,321 B1 | 11/2001 | Hiraga et al. | |
| 6,440,877 B1 | 8/2002 | Yamazaki et al. | |
| 6,495,313 B1 | 12/2002 | Yoshioka et al. | |
| 6,503,831 B2 | 1/2003 | Speakman | |
| 6,524,884 B1 | 2/2003 | Kim et al. | |
| 6,538,390 B2 | 3/2003 | Fujita et al. | |
| 6,616,762 B2 | 9/2003 | Inada et al. | |
| 6,623,097 B2 | 9/2003 | Okada et al. | |
| 6,634,806 B2 | 10/2003 | Toshima et al. | |
| 6,638,404 B2 | 10/2003 | Terashima et al. | |
| 6,696,105 B2 | 2/2004 | Hiroki et al. | |
| 6,699,739 B2 | 3/2004 | Yamazaki et al. | |
| 6,706,647 B1 | 3/2004 | Tsutsumi et al. | |
| 6,707,060 B2 | 3/2004 | Yu et al. | |
| 6,730,357 B2 | 5/2004 | Kawase | |
| 6,822,256 B2 | 11/2004 | Kwasnick et al. | |
| 6,828,042 B2 | 12/2004 | Imanishi | |
| 6,830,494 B1 | 12/2004 | Yamazaki et al. | |
| 6,838,192 B2 | 1/2005 | Miyashita et al. | |
| 6,843,937 B1 | 1/2005 | Kiguchi et al. | |
| 6,872,672 B2 | 3/2005 | Yamazaki et al. | |
| 6,878,312 B1 | 4/2005 | Kanbe et al. | |
| 6,903,731 B2 | 6/2005 | Inukai | |
| 7,098,084 B2 | 8/2006 | Tanaka et al. | |
| 7,151,015 B2 | 12/2006 | Suzawa et al. | |
| 7,179,756 B2 | 2/2007 | Yamazaki et al. | |
| 7,199,515 B2 | 4/2007 | Seo et al. | |
| 7,264,979 B2 | 9/2007 | Yamagata et al. | |
| 7,279,194 B2 | 10/2007 | Hiroki et al. | |
| 7,378,291 B2 | 5/2008 | Yamazaki et al. | |
| 2001/0003602 A1 | 6/2001 | Fujita | |
| 2001/0009691 A1 | 7/2001 | Thompson et al. | |
| 2002/0118245 A1 * | 8/2002 | Jagannathan et al. | 347/21 |
| 2005/0035708 A1 | 2/2005 | Yamazaki et al. | |
| 2005/0058770 A1 | 3/2005 | Kiguchi et al. | |
| 2005/0156148 A1 | 7/2005 | Kanbe et al. | |

FOREIGN PATENT DOCUMENTS

| | | |
|---|---|---|
| EP | 0 999 595 | 5/2000 |
| EP | 1 021 070 | 7/2000 |
| EP | 1 058 314 | 12/2000 |
| EP | 1 093 167 | 4/2001 |
| EP | 1 394 236 | 3/2004 |
| JP | 06-082796 | 3/1994 |
| JP | 11-040358 | 2/1999 |
| JP | 2000-208252 | 7/2000 |
| JP | 2000-340801 | 12/2000 |
| JP | 2001-093673 | 4/2001 |
| JP | 2001-297876 | 10/2001 |
| JP | 2001-326178 | 11/2001 |

* cited by examiner

PROCESS OF MANUFACTURING LUMINESCENT DEVICE

BACKGROUND OF THE INVENTION

1. Field of the Invention

The present invention relates to a light emitting device formed by building a semiconductor element (element using a semiconductor thin film) onto a substrate using a light emitting element that has a film (hereafter referred to as an "organic compound layer") containing an organic compound in which fluorescence or phosphorescence is obtained by the application of an electric field, typically an EL (electro luminescence) display device. In addition, the present invention relates to electronic equipment that uses an EL display device as a display (display portion). Note that light emitting devices are also referred to as OLEDs (organic light emitting diodes).

Note that the term "light emitting element" in this specification indicates elements in which an organic compound layer is formed between a pair of electrodes. The term "light emitting device" indicates image display devices using light emitting elements or light emitting devices. Further, modules in which a connector, for example, an anisotropic conductive film (flexible printed circuit, FPC), a TAB (tape automated bonding) tape, or a TCP (tape carrier package) is attached to light emitting elements, modules in which the tip of the TAB tape or TCP is provided with a printed wiring board, and modules in which an IC (integrated circuit) is directly mounted to light emitting elements by a COG (chip on glass) method are all included in the category of light emitting devices.

2. Description of the Related Art

The development of light emitting devices (EL display devices) using EL elements as light emitting elements that utilize EL (electro luminescence) phenomenon of light emitting organic materials has recently been advancing. This is because it is considered that the EL display devices have a wider angle of view and superior visibility, compared to conventional liquid crystal display devices.

Further, there are two types of EL display devices, a passive type (simple matrix type) and an active type (active matrix type), and the development of both the types is flourishing. In particular, active matrix EL display devices are in the spotlight at present. Furthermore, organic compound materials which become EL layers (strictly speaking, light emitting layers), the EL element center, can be divided into low molecular weight organic compound materials and high molecular weight (polymer) organic compound materials, and both the materials are being researched.

Ink jet printing, evaporation, and spin coating methods are known as methods of forming a film of these organic compound materials.

However, when considering the manufacture of a full color flat panel display with the use of red, green, and blue light emission colors, none of the aforementioned film formation methods can be called ideal for a variety of reasons, and this has been a problem for low cost, large-scale production.

SUMMARY OF THE INVENTION

An object of the present invention is thus to provide a means for forming a film made from an organic compound material at low cost using an organic compound material having high light emission efficiency.

Further, organic compound materials generally used in light emitting elements are high cost. Therefore it is preferable to use such materials as effectively as possible.

The present invention is characterized by the fact that a film containing an aggregate of an organic compound is formed on a substrate under an inactive gas atmosphere by uniformly spreading a colloidal solution (also referred to as sol) into which the aggregate of the organic compound is dispersed. It should be noted that in the present invention, an organic compound exists as a particulate that several pieces of organic compounds are aggregated in liquid.

Conventionally, an organic compound material was dissolved in a solvent having a high solubility in the relevant organic compound, a solution was made and a film formation was performed by an ink jet method or a spin coat method.

Therefore, in the above-described conventional film formation method, an organic compound having a high solubility has been preferably used. Moreover, as for an organic compound material having a low solubility, in order to enhance the solubility, it was made molecular structure into which a substituent has been introduced, and the solubility was enhanced, but, the color purity was deteriorated by introducing the substituent, and further, the luminescent color has been also actually changed. For example, the luminescent color of the organic compound material indicated by PPV (1,4-polyphenylenevinylene) is green, but, the luminescent color of the organic compound material indicated by RO-PPV (2,5-dialkoxy-1,4-phenylenevinylene) in which an alkoxy substituent has been introduced for the purpose of enhancing the solubility is orange.

Moreover, among a number of organic compound materials, particularly a material capable of converting triplet excitation energy into luminescence, for example a metal complex of which platinum is the backbone metal (hereinafter, also referred to as platinum complex), and a complex of which iridium is the backbone metal (hereinafter, also referred to iridium complex), since these are mixed as dopants with the other multiple organic compound materials and solvents, it was difficult to adjust the respective ratios of these occupying in the whole compound and synthesize it.

The present invention is the method for forming a film with any state of the organic compound material in liquid, and particularly, it is characterized by forming an organic compound film of excellent quality using an organic compound material which is not easily dissolved. Since in the present invention, a film is formed by spreading liquid containing an organic compound, the film formation can be performed in a short time period. Moreover, a method for preparing liquid containing an organic compound to be spread can be made simplified. Moreover, in the present invention, in the case where a film having the desired pattern is formed, the film formation is performed using a mask, specifically, the film formation is performed by making it go through the opening of the mask. Moreover, in the present invention, since it is performed free fall, there are slight wraparounds except that it passes through the opening of the mask.

Moreover, in the present invention, after liquid containing an organic compound has been spread under the nitrogen atmosphere, it is preferable that the solvent is evaporated by heating under an inactive atmosphere or under the vacuum and then an organic compound film is formed.

As a constitution involving in a method for preparing the invention disclosed in the present specification, there is a method for preparing a luminescent device characterized by the fact that an aggregate of an organic compound is made dispersed particulate, a composition in which the dispersion medium has been made liquid is repeatedly spread by a nozzle (also referred to as spreading nozzle), and a film containing an aggregate of an organic compound is formed on an adherend.

Moreover, in the above-described constitution, in order to control the formation position of a film containing an aggregate of the above-mentioned organic compound, the above-mentioned composition or the above-mentioned mask may be electrified.

Moreover, in the above-described respective constitutions, the above-mentioned composition is liquid having the fluidity, and characterized by the fact that an aggregate of an organic compound is dispersed as a colloidal particulate in liquid.

Moreover, in the above-described respective constitutions, the above-mentioned organic compounds are one or more kinds selected from quinacridone, tris (2-phenylpyridine) iridium and bathocuproine.

Moreover, in the above-described respective constitutions, the above-described organic compounds are one or more kinds selected from poly (1,4-phenylenevinylene), poly (1,4-naphthalenevinylene), poly (2-phenyl-1,4-phenylenevinylene), polythiophene, poly (3-phenylthiophene), poly (1,4-phenylene) and poly (2,7-fluorene).

Moreover, in the present invention, an organic compound may be a particulate in which several pieces of an organic compound are aggregated in liquid, or may be an organic compound partially dissolved in liquid. Therefore, a composition in which an organic compound has been dissolved in liquid is spread on an adherend and a film containing the organic compound may be formed. As a constitution of the other invention, there is a method for preparing a luminescent device characterized by the fact that a composition in which an organic compound has been dissolved in liquid is repeatedly spread from a nozzle and a film containing the organic compound is formed on an adherend.

Moreover, in the above-described respective constitutions, in order to control the formation position of the film containing an aggregate of the above-described organic compounds, a mask is arranged between the above-mentioned nozzle and the above-mentioned adherend, and a film containing an aggregate of the organic compound may be formed by making it pass through the opening of the mask.

Furthermore, in order to control the formation position of the film containing the organic compound, the above-mentioned composition, or the above-mentioned mask may be electrified.

It should be noted that in the above-described constitutions, the above-mentioned composition is liquid having the fluidity, characterized by the fact that at least one portion of the organic compound is dissolved in the liquid.

Moreover, in the above-described respective constitutions, the above-mentioned liquids are characterized by being one or more kinds selected from alcohols, toluene and water.

Moreover, in the above-described constitutions, the formation of the above-mentioned films is characterized by being performed under an inactive gas atmosphere.

Moreover, in the above-described respective constitutions, it is characterized by the fact that the ejection outlet of the above-mentioned nozzle is one or two or more.

Moreover, in the above-described respective constitutions, the above-mentioned adherend is a substrate on which a switching element is provided.

Moreover, in the above-described respective constitutions, a film may be formed on the above-mentioned adherend while the above-mentioned nozzle is moved.

Moreover, in the above-described respective constitutions, in order to control the formation position of the above-described film, the electric field may be generated between the above-mentioned nozzle and the above-mentioned adherend.

Moreover, in the above-described constitutions, the formation of the above-mentioned film may be performed by heating the above-mentioned adherend and by spreading at the same time. Since the burning and the spreading can be carried out at the same time, the throughput is enhanced.

Moreover, the liquid portion is vaporized (evaporation) at the time when the liquid is ejected from a nozzle by heating liquid containing an organic compound, and spread as a powdered state or gel state, and immediately after it is reached at the adherend, it may be made so that these are in turn laminated on the heated adherend. As a constitution of the other invention, there is a method for preparing a luminescent device characterized by the fact that an aggregate of an organic compound is made dispersed particulate, after the composition in which the dispersion medium has been made liquid is discharged from the nozzle, only liquid is partially or entirely evaporated by heat, powder consisted of an aggregate of an organic compound or a gel (soft solid state) consisted of an aggregate of an organic compound is spread, and a film is formed by in turn bonding aggregates of the organic compound together of which have been adhered on an adherend (heated). In this way, the flocculation can be prevented and it can be uniformly spread by partially or entirely evaporating the liquid containing an organic compound.

It should be noted that a luminescent element (EL element) has a layer (hereinafter, referred to as EL layer) containing an organic compound in which an Electro Luminescence is obtained by applying the electric field, an anode and a cathode. As luminescence in organic compounds, there are a luminescence (fluorescence) generated at the time when returning from the singlet excitation state to the ground state, and a luminescence (phosphorescence) generated at the time when returning from the triplet excitation state to the ground state, but, a luminescent device prepared according to the present invention can be applied even if either of luminescence is used.

Moreover, an EL layer is consisted of a laminated structure. Representatively, hole transport layer/luminescent layer/electron transport layer are listed on an anode. This structure is very high at luminescence efficiency, and at the present time, almost all of the luminescent devices of which their developments proceeded employ this structure. Moreover, except for this, structures in which hole implantation layer/hole transport layer/luminescent layer/electron transport layer are in turn laminated, or structures in which hole implantation layer/hole transport layer/luminescent layer/electron transport layer/electron implantation layer are in turn laminated may be also available. A fluorescent pigment or the like may be doped into a luminescent layer. Moreover, as a luminescent layer, there are also a luminescent layer having a hole transport characteristic and a luminescent layer having an electron transport characteristic and the like. Moreover, the whole of these layers may be formed using low molecular weight compound based materials or the whole of these layers may be formed using high molecular weight compound based materials. It should be noted that in the present specification, all of the layers provided between a cathode and an anode are generally referred to as a layer containing an organic compound (EL layer). Therefore, the above-mentioned hole implantation layer, hole transport layer, luminescent layer, electron transport layer and electron implantation layer are all included in an EL layer. Moreover, a layer (EL layer) containing an organic compound may contain inorganic materials such as silicon and the like.

Moreover, in the case where a luminescence of an EL element is intended to obtain using a realistic low voltage, it is necessary to make the film thickness of an organic compound layer thinner in order to secure the electric field strength required for the luminescence of the EL element. Therefore, in the present invention, the film thickness of an organic compound layer is made in the range from 1 nm or more to 1 µm or less.

Moreover, the present invention is capable of dispersing an organic compound in a particulate as a dopant without forming a film. For example, an organic compound in a particulate may be dispersed on the organic compound obtained by a coat method or a vapor deposition method by a method according to the present invention. Moreover, an aggregate of the above-mentioned organic compound may be a capsule having a uniform shape.

Moreover, a metal material having a small work function (Al—Li, Mg—Ag, Cs, CaN, $CaF_2$ or the like) as well as an organic compound may be formed on a cathode by dispersing in liquid. It can be a cheaper process. In this case, a method is not limited to a method for forming a film by discharging it from a nozzle and spreading it, a method for forming a film by a spray method, or a method for forming a film by an ink jet method may be available.

As for the other constitution of the present invention, there is a method for preparing a luminescent device characterized by the fact that an aggregate of a metal compound is made dispersed particulate on a layer containing an organic compound formed on an anode, the component in which dispersion medium is made liquid is discharged, and a cathode consisted of a metal compound is formed. It should be noted that the above-mentioned metal compound is characterized by containing Li, Al, Ag, Mg, Cs or Ca.

Moreover, in the above-described constitution, in order to control the formation position of the above-mentioned metal compound, a mask is arranged and a cathode consisted of a metal compound may be formed by making it pass through the opening of the mask. Moreover, it is preferable that unnecessary portions are selectively removed by an oxygen plasma processing method or the like.

Moreover, in a method for preparing a luminescent device for making an anode pass the luminescence through, after the anode consisted of an electrically conductive transparent film and an organic compound layer have been formed, on it, a thin film is formed by dispersing Al—Li, Mg—Ag, Cs, CaN, $CaF_2$ and the like, and further, an electrically conductive film (aluminum film and the like) may be laminated and formed.

As the other constitution of the present invention, there is a method for preparing a luminescent device characterized by the fact that an aggregate of a metal compound is made dispersed particulate on the layer containing an organic compound formed on an anode, it has further a step of forming a thin film of a metal compound by discharging the composition in which the dispersion medium is made liquid and a step of forming a thicker metal film in film thickness than the relevant thin film on the thin film of the relevant metal compound.

Moreover, in the above-described constitution, the above-mentioned metal film is characterized by containing Li, Al, Ag, Mg, Cs or Ca. Moreover, in the above-mentioned constitution, the above-mentioned metal compound is characterized by containing Li, Al, Ag, Mg, Cs or Ca.

Moreover, in a method for preparing a luminescent device in which a cathode makes the luminescence pass through itself, after an anode and an organic compound layer have been formed, on it, Al—Li, Mg—Ag, Cs, CaN, $CaF_2$ and the like are dispersed and a thin film is formed, and further, an electrically conducting transparent film (ITO, ZnO, $SnO_2$, AZO and the like) may be laminated and formed.

As the other constitution of the present invention, there is a method for preparing a luminescent device characterized by the fact that an aggregate of metal compound is made dispersed particulate on the layer containing an organic compound formed on an anode, it has a step of forming a thin film of a metal compound by discharging the composition in which the dispersion medium is made liquid and a step of forming an electrically conducting transparent film on the thin film of the above-mentioned metal compound.

In the above-described constitution, a thin film of the above-mentioned metal compound is characterized by transmitting light. In addition, the above-mentioned metal compound is characterized by containing Li, Al, Ag, Mg, Cs, or Ca.

Moreover, a vapor deposition device is difficult to make into a larger scale. If the size of the substrate becomes larger, it is difficult to deal with. Hence, the present invention provides a method for forming a luminescent element without using a vapor deposition device. For example, an anode is formed by a sputtering method, an organic compound layer is formed by a coat method (ink jet method, spin coat method or the like), and a cathode can be formed by a method for forming a film according to the present invention. Moreover, an anode is formed by a sputtering method, an organic compound layer is formed by a coat method, the lower layer of a cathode is formed by a method for forming a film according to the present invention, and an upper layer of the cathode can be formed by a sputtering method. According to the present invention, a method for preparing a luminescent device suitable for mass production can be realized.

PREFERRED EMBODIMENTS OF THE INVENTION

The embodiment of the present invention will be described below.

Figure 1:
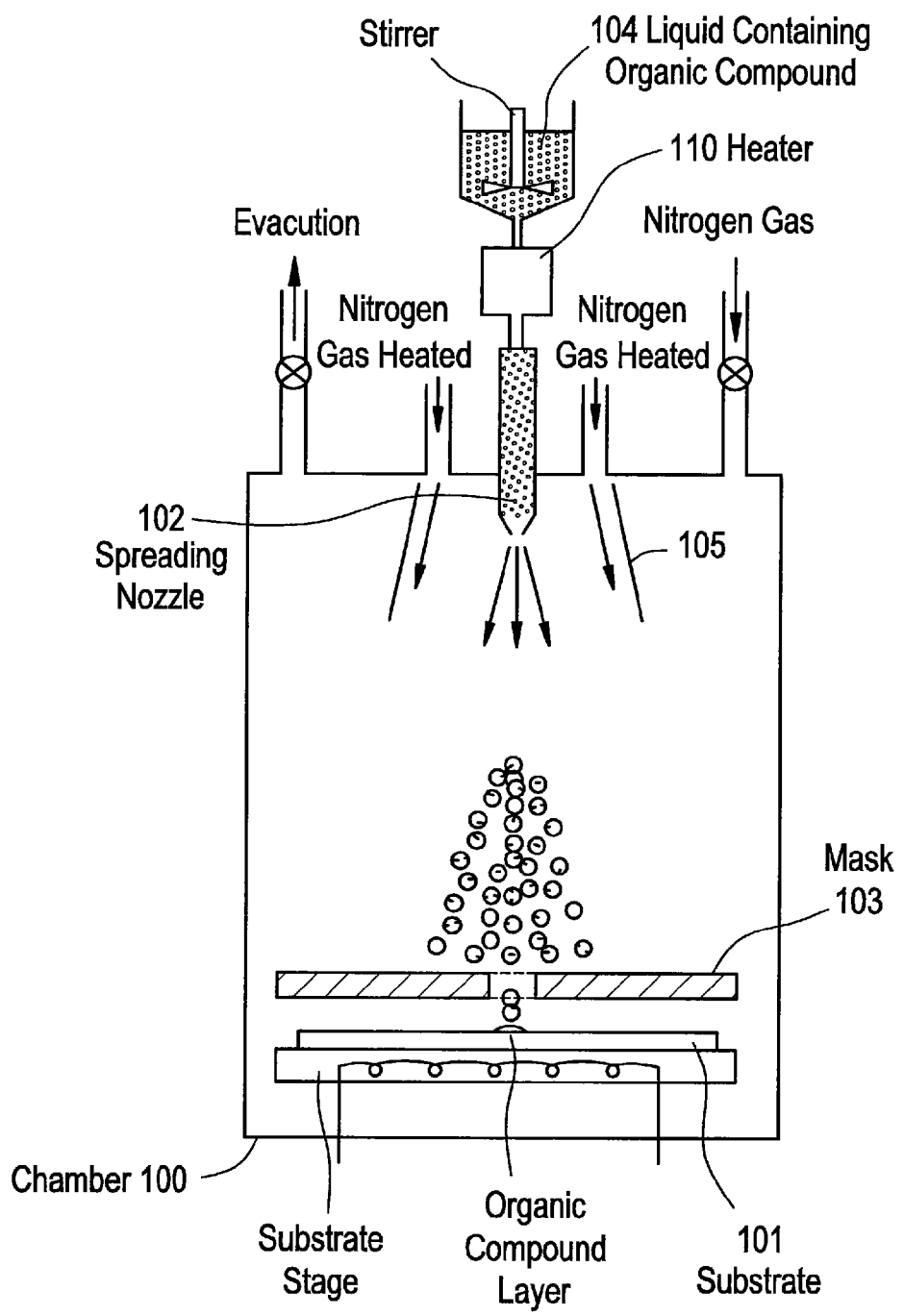
FIG. 1 is a diagram showing the present invention.

FIG. 1 is a diagram schematically showing the present invention.

In FIG. 1, within a chamber 100, a substrate 101, a mask 103 and a spreading nozzle 102 are arranged, and the ejection outlet of the spreading nozzle 102 faces towards the substrate side. Moreover, as for the atmosphere within the chamber 100, it is controlled as an inactive gas atmosphere (where it is nitrogen atmosphere). Moreover, a container is arranged at the position where it is segregated from the chamber 100, and liquid containing an organic compound 104 is contained. This liquid has the fluidity, an aggregate of an organic compound is dispersed as a colloidal particulate. It should be noted that the liquid is uniformly dispersed by means for stirring (stirrer or the like).

It should be noted that here, as an organic compound, an iridium complex which is a low molecular weight material having a high luminescence efficiency, representatively, tris (2-phenylpyridine) iridium is used. The molecular formula of this iridium complex is shown as follows:

[Chemical formula 1]

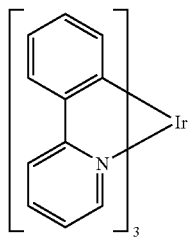

In the present invention, it is made in a state such that the iridium complex or its aggregate and bathocuproine (hereinafter, abbreviated as BCP) are dispersed in liquid such as toluene or alcohols as a colloidal particulate.

On the other hand, in the case where the coat method is used, a coating liquid has been prepared by dispersing iridium complex of several wt % into liquid into which 2-(4-biphenyl)-5-(4-tert-butylphenyl)-1,3,4-oxadiazole (abbreviated as PBD) and poly (N-vinylcarbazole) (abbreviated as PVK) are dissolved in toluene as a solvent at a ratio as a dopant. It was difficult to prepare this coating liquid, but liquid 204 of the present invention can be obtained in a short time period and in a simple manner.

Moreover, a tube extended from the container for containing the liquid 104 containing an organic compound is connected to the spreading nozzle 102. After the liquid 104 within the container has been heated by a heater 110, it is ejected from the ejection outlet of the spreading nozzle. At this time, the discharged liquid is hit by nitrogen gas heated and is spread in a fog state. In FIG. 1, a skirt 105 is provided on the chamber, and a configuration is made so that the liquid is efficiently heated by nitrogen gas and becomes in a fog state or vaporized. Here, an example in which a gas heated as heating means for the liquid, a skirt and a heater are used, but not particularly limited, inside of the chamber may be heated, or one of these heating means or a plurality of these may be used. It should be noted that the liquid 104 is liquid having a viscosity capable of being discharged from the spreading nozzle 102. Instead of nitrogen gas, inactive gas such as argon, helium, neon can be used. Noted that although here it is not shown in FIGS., a device for controlling the flow volume of the gas and heating temperature is to be provided. Furthermore, a device for controlling the flow volume of the liquid 104 may be provided. Moreover, a mask 103 for selectively forming a layer containing an organic compound is provided between the spreading nozzle and the substrate. However, if it is formed on the whole surface of it, needless to say, the mask 103 is not necessarily required.

Moreover, it is preferable that an organic compound is uniformly dispersed in the liquid, and as for a pipe for connecting the container and the spreading nozzle, the spread nozzle itself may be vibrated by ultrasonic wave or the like.

Then, one portion of the liquid containing an organic compound is evaporated by heat by the above-mentioned ejection method, portion passing through the opening of the mask drops on the substrate 101 and uniformly spread. The organic compounds adhered on the substrate 101 (heated by a heater provided on the substrate stage) are in turn bonded each other and a layer containing an aggregate of organic compound is sedimented.

Moreover, a heater for heating provided on the substrate stage contacting with the substrate may be set so that the surface temperature of the substrate is in the range from room temperature to 200° C. Furthermore, the burning of the film may be performed at a high temperature.

Moreover, the formation position of the film may be appropriately controlled by electrifying or grounding the liquid (when it is vaporized, it is in a powdered state or gel state) using electrodes or the like provided in the spreading nozzle, within the container, chamber, substrate stage or mask. Moreover, the gas itself heated in FIG. 1 is provided with charge, the liquid (when it is vaporized, it is in a powdered state or gel state) can be also electrified. Moreover, in the case where it is electrified, the liquid is more easily electrified when it is in a powdered state, the controllability of the film formation is enhanced.

Figure 2:
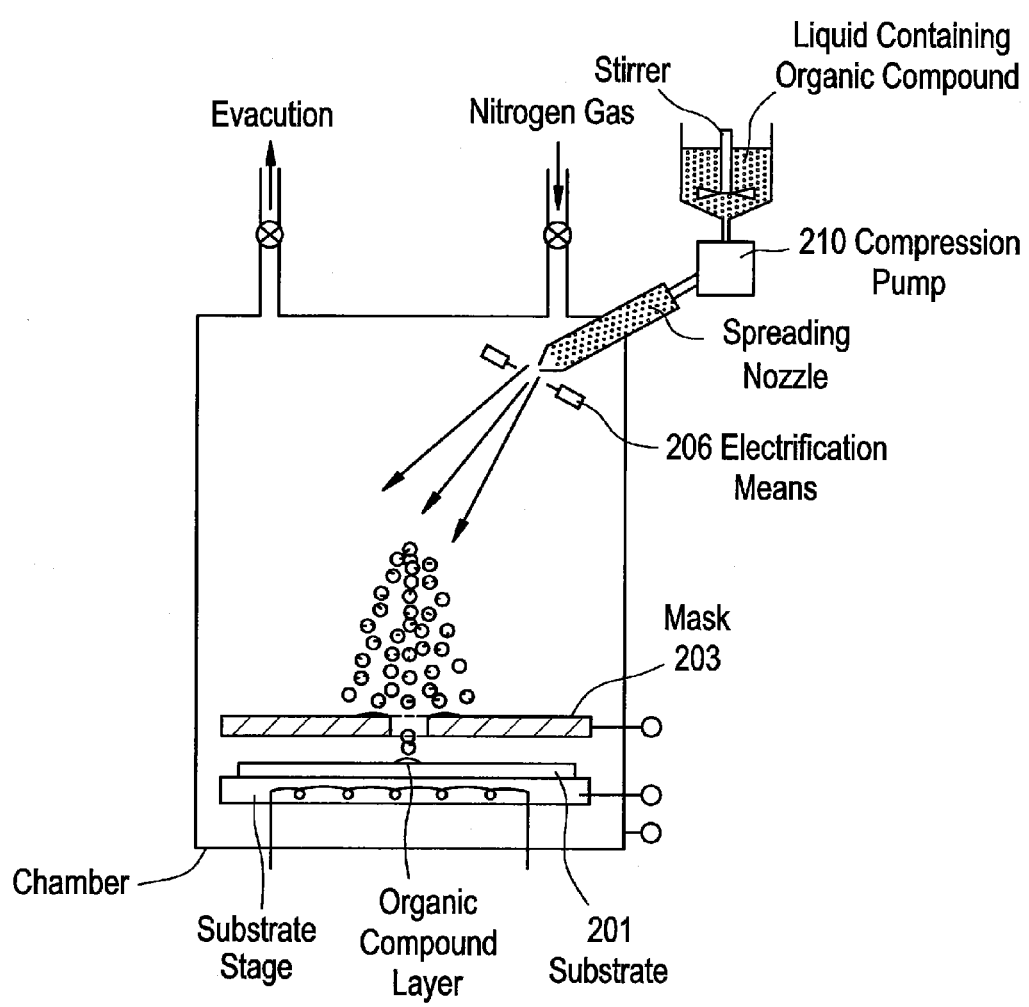
FIG. 2 is a diagram showing the present invention.

Moreover, as shown in FIG. 2, a method in which the pressure of the pipe extending from the container to the spreading nozzle is heightened by a compression pump 210 or the like, the liquid is flown toward the ejection outlet of the spreading nozzle, the liquid is discharged into the chamber, made it free fall and spread may be used.

It should be noted that the formation position of the film may be appropriately controlled by electrifying or grounding the liquid using electrodes or the like provided within the container, chamber, substrate stage or mask. In FIG. 2, an electrification means 206 in a ring shape, for example, a corona discharge electrode is provided at the ejection outlet of the spreading nozzle. However, the electrification means 206 may be not particularly provided.

Then, while performing the ejections indicated in the description described above intermittently or in series, the spreading nozzle shown in FIG. 2 is moved in the X direction or the Y direction, the desired pattern can also be obtained.

Although here, the iridium complex is exemplified, the present invention is capable of being applied to other low molecular weight materials (quinacridone, bathocuproine and the like), and further to high molecular weight materials (poly (1,4-phenylenevinylene), poly (1,4-naphthalenevinylene) poly (2-phenyl-1,4-phenylenevinylene), polythiophene, poly (3-phenylthiophene), poly (1,4-phenylene), poly (2,7-fluorene) and the like).

Moreover, in the case where a layer containing an organic compound is laminated using a method for forming a film according to the present invention, it is desirable that the second layer containing an organic compound formed later is formed using liquid in which the first layer containing an organic compound formed previously is not dissolved as a dispersion medium.

It should be noted that for the sake of simplifying, in FIG. 1 and FIG. 2, a holder for fixing the substrate and the mask is not described nor shown.

In FIG. 1 and FIG. 2, the ejection outlet of the spreading nozzle 202 on which only one outlet is provided shows one example, but, the spreading nozzle 202 may be provided with plural outlets. If plural outlets are provided, the ejection outlet such as an ejection outlet for spreading liquid like a sprinkler may be provided at the spreading nozzle.

Moreover, the present invention can correspond to the substrate even if it is in a larger scale, for example, a substrate having one side of the substrate being 1 m is used, and is suitable as means for mass-producing because its multiple pattern is utilized.

Moreover, a spreading device for forming these organic compound films is not limitedly used. If it is a wet type spreading device, for example, one for spreading a spacer of liquid crystal displaying device used in the LCD manufacturing step may be appropriately modified and used.

The present invention consisted of the constitutions described above will be described more in detail below in conjunction with Examples indicated below.

EXAMPLES

Example 1

In the present Example, a method for preparing a pixel section of a luminescent device will be described below with reference to FIG. 3 and FIG. 4. Moreover, in the present Example, the case where a thin film transistor (TFT) is formed as a semiconductor element will be described below.

First, a crystalline silicon film is formed on the transparent substrate 301 in a film thickness of 50 nm. It should be noted that as a method for forming a crystalline silicon film, known means might be used. Subsequently, semiconductor layers 302 and 303 (hereinafter, referred to as active layer) consisted of a crystalline silicon film in an island shape are formed by patterning a crystalline silicon film. Subsequently, a gate insulating film 304 covering the active layers 302 and 303 and consisted of a silicon oxide film is formed. Subsequently, gate electrodes 305 and 306 are formed on the gate insulating film 304 (FIG. 3 A). As a material for forming gate electrodes 305 and 306, alloy materials in which elements are selected form Ta, W, Ti, Mo, Al and Cu or the above-mentioned elements are made as the main component or compound materials may be used. Here, tungsten film or tungsten alloy film having a film thickness of 350 nm is used for the gate electrodes 305 and 306. Moreover, the gate electrode may be consisted of a laminated structure having two layers or more, may be consisted of a three-layers structure in which a tungsten film having a film thickness of 50 nm, an aluminum and silicon alloy (Al—Si) having a film thickness of 500 nm and a titanium film having a film thickness of 30 nm are in turn laminated.

Figure 3A:
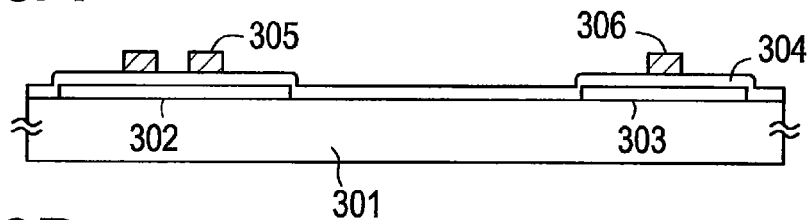
FIGS. 3A to 3E are diagram showing preparing processes of a luminescent device.
Figure 3B:
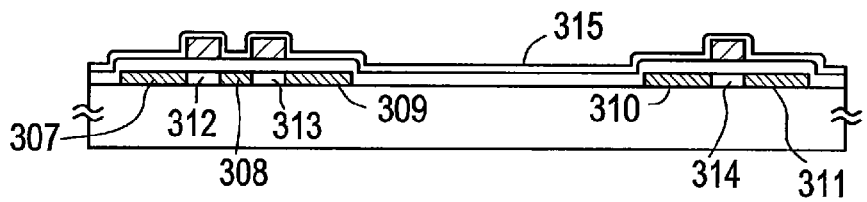
Figure 4A:
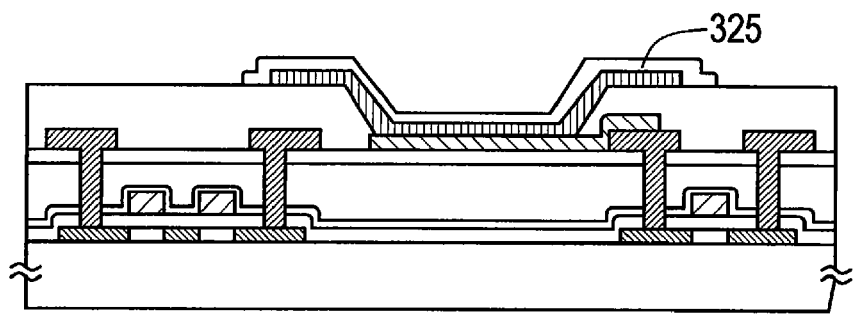
FIGS. 4A to 4C are diagram showing preparing processes of a luminescent device.

Subsequently, as shown in FIG. 3B, elements belonging to XIII group of the periodic table (representatively, boron) are added by utilizing the gate electrodes 305 and 306. As an additive method, known means may be used. In this way, impurity regions showing a p-type electrically conductive type (hereinafter, referred to as p-type impurity region) 307 through 310 are formed. Moreover, immediately beneath the gate electrodes 305 and 306, channel formation regions 312 through 314 are divided and fixed. It should be noted that the p-type impurity regions 307 through 311 are source regions or drain regions of TFT.

Subsequently, a protective film (here, silicon nitride film) 315 is formed in a film thickness of 50 nm, after that, the element belonging to XIII group of the periodic table which has been added is activated by performing the heating processing. This activation may be performed by furnace anneal, laser anneal, or lump anneal, or in combination. In the present Example, the heating processing is performed at 500° C. for 4 hours under the nitrogen atmosphere.

When the activation is terminated, subsequently if hydrogenation processing is performed, it becomes effective. As for the hydrogenation processing, known hydrogen anneal technology or plasma hydrogenation technology may be used.

Figure 3C:
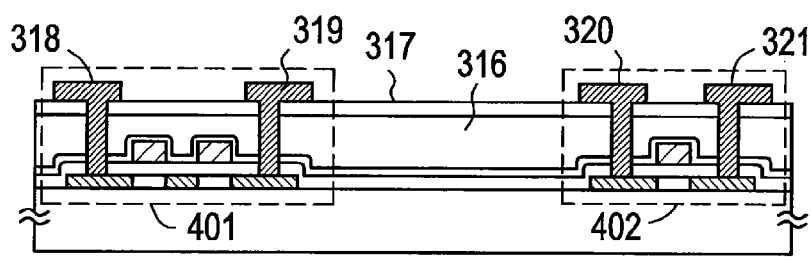

Subsequently, as shown in FIG. 3C, the first interlayer insulating film 316 consisted of an organic resin film such as polyimide, acryl, polyimideamide or the like is formed in a thickness of 800 nm. After having been coated by spinner, as to these materials, the surface of it can be made smooth by forming it by burning using heating or polymerizing it. Moreover, as to an organic resin material, since it has in general lower dielectric constant, parasitic capacitance can be reduced. It should be noted that as the first interlayer insulating film 316, an inorganic insulating film may be used.

Subsequently, the second interlayer insulating film 317 is formed on the first interlayer insulating film 316 so that the degas from the first interlayer insulating film 316 does not have an adverse influence on the luminescent element. The second interlayer insulating film 317 may be formed by an inorganic insulating film, representatively, silicon oxide film, silicon oxynitridation film, silicon nitride film or a laminated film in which these are combined, it is made at reaction pressure 20-200 Pa, at the substrate temperature of 300-400° C. by a plasma CVD method, and formed by discharging it at a high frequency (13.56 MHz) and power density of 0.1-1.0 W/cm$^2$. Otherwise, a hardened film containing one or more kinds of gas elements selected from hydrogen, nitrogen, carbon halide, hydrogen fluoride or noble gas may be formed by performing plasma processing on the surface of the interlayer insulating film.

Subsequently, a resist mask having the desired pattern is formed, a contact hole for reaching the drain region of TFT is formed and wirings 318 through 321 are formed. As a wiring material, an electrically conductive metal film, such as Al and Ti, these alloy materials are used, and after the formation of a film is performed by a sputtering method or a vacuum vapor deposition method, it may be patterned into the desired shape.

When reaching this state, TFT is completed. In the present Example, at a pixel section of a luminescent device, as shown in FIG. 3C, a TFT for switching 401 and a TFT for controlling current 402 are formed, at the same time, a TFT for deleting (not shown) is formed. It should be noted that a gate electrode of the TFT for deleting is formed by one portion of the gate wiring different from the gate wiring 305 for forming a gate electrode of the TFT for switching 401. It should be noted that in the present Example, all of these TFT are formed by p-channel type TFTs.

Moreover, at the same time, hold capacity is formed. The hold capacity is formed by the lower hold capacity formed by the semiconductor layer formed at the same time with the active layer of TFT, the wirings for forming the gate insulating films and the gate electrodes, and the upper hold capacity formed by the wirings for forming gate electrodes, the protective film, the first interlayer insulating film, the second interlayer insulating film and power supplying wirings. Moreover, the semiconductor layer is electrically connected to the power supplying wirings.

Figure 3D:
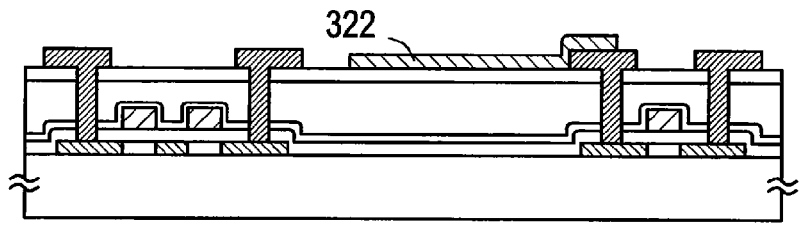

Subsequently, an electrically conductive film having a transparency which is an anode of the luminescent element, here, an ITO film is formed. Moreover, as an electrically conductive film, a material having a larger work function than that of the material for forming a cathode is used, and further, a material having a lower sheet resistance than that of the ITO film, concretely, a material such as platinum (Pt), chromium (Cr), tungsten (W), or nickel (Ni) can be used. It should be noted that it is preferable that the film thickness of the electrically conductive film at this time is made in the range from 0.1 to 1 μm. Subsequently, as shown in FIG. 3D, an anode 322 is formed by etching the electrically conductive film.

Subsequently, an organic resin film consisted of polyimide, acryl and polyimideamide is formed on the whole surface. As for these, a thermally hardened material which is hardened by heating, or a photosensitive material which is hardened by irradiating the ultraviolet ray can be employed. In the case where a thermally hardened material has been used, a resist mask is subsequently formed, an insulating layer 323 having the opening is formed on the anode 322 by a dry etching. In the case where a photosensitive material is used, an insulating layer 323 having the opening on the anode 322 is formed by performing exposing and developing processing using a photomask. In any case, the insulating layer 323 is formed so that it covers the edge section of the anode 322 and it has the edge in a tapered shape. The coverage of the organic compound layer formed subsequently can be made better by forming the edge in a tapered shape.

Subsequently, an organic compound layer is formed on the anode 322. Here, out of organic compound layers formed by the organic compound indicating the three kinds of colors, red, green and blue luminescence, the procedure in which the green organic compound layer is formed will be described in detail below. An organic compound layer of the green color luminescence in the present Example is, as shown in FIG. 5A, consisted of an organic compound having a hole implantation characteristic, an organic compound having hole transport characteristic, a host material, an organic compound having the luminescence, an organic compound having a blocking characteristic and an organic compound having an electron transport characteristic. It should be noted that in FIG. 5A, as for the portions corresponding to the portions in FIG. 3 and FIG. 4, the same reference numerals are used. It should be noted that in FIG. 5A, in an amorphous thin film of uniform host material, particles consisted of guest material molecules are scattered.

First, an organic compound layer (hole implantation layer 324a) is formed in a film thickness of 15 nm using copper phthalocyanine (hereinafter, abbreviated as Cu—Pc) which is an organic compound having a hole implantation characteristic on the anode 322 by a coat method or a vapor deposition method, and an organic compound layer (hole transport layer 324b) is formed in a film thickness of 40 nm using 4,4'-bis [N-(1-naphthyl)-N-phenyl-amino]-biphenyl (hereinafter, abbreviated as α-NPD) which is an organic compound having a hole transport characteristic.

Figure 3E:
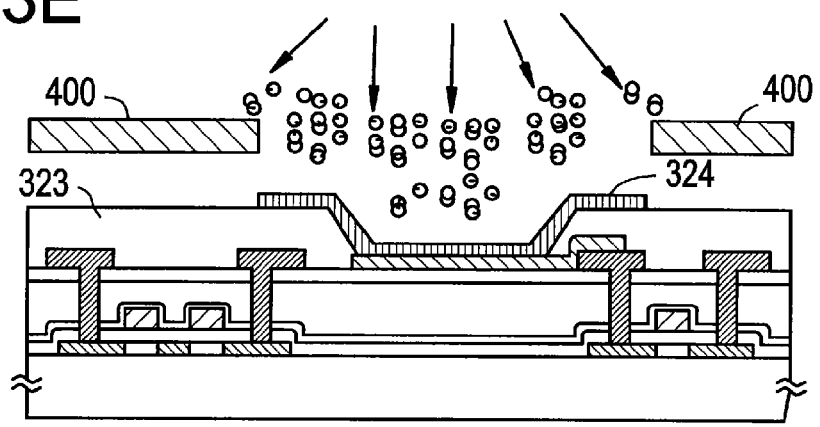

Subsequently, a composition in which an iridium complex which is an organic compound having the luminescence characteristic, tris (2-phenylpyridine) iridium (Ir(ppy)$_3$) and bathocuproine (BCP), an organic compound which is to be a host (hereinafter, host material) are dispersed in toluene, is spread from the spreading nozzle (not shown) by means used in the embodiment of the present invention, and an organic compound layer (luminescent layer 324c) is formed in a film thickness in the range from 25 to 40 nm (FIG. 3E). Moreover, here, an organic compound layer is selectively formed using the mask 400. It should be noted that the iridium complex is insoluble in toluene, and BCP is also insoluble in toluene.

Furthermore, the composition in which bathocuproine (BCP) which is an organic compound having a blocking characteristic is dispersed in toluene is spread from the spreading nozzle, as similarly indicated in the embodiment of the present invention, an organic compound layer (blocking layer 324d) is formed in a film thickness of 8 nm.

Subsequently, an organic compound layer (electron transport layer 325) is formed in a film thickness of 25 nm using tris (8-quinolinolato) aluminum (hereinafter, abbreviated as Alq$_3$) which is an organic compound having an electron transport characteristic by a coat method or a vapor deposition method.

It should be noted that here as an organic compound layer of green color luminescence, the cases where these are formed using organic compounds having 5 different kinds of functions have been described, but, the present invention is not limited to that, and as an organic compound indicating green color luminescence, known materials can be used.

In this way, in the present example, out of these organic compound layers, only examples of luminescent layer and blocking layers formed by methods indicating in the embodiments of the present invention have been indicated, but, the present invention is not limited to that, at least one layer or all of the organic compound layers may be formed by the methods indicated in embodiments of the present invention.

Figure 4B:
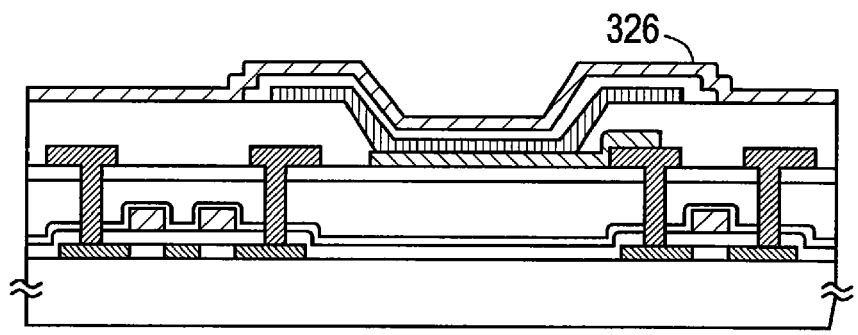
Figure 5A:
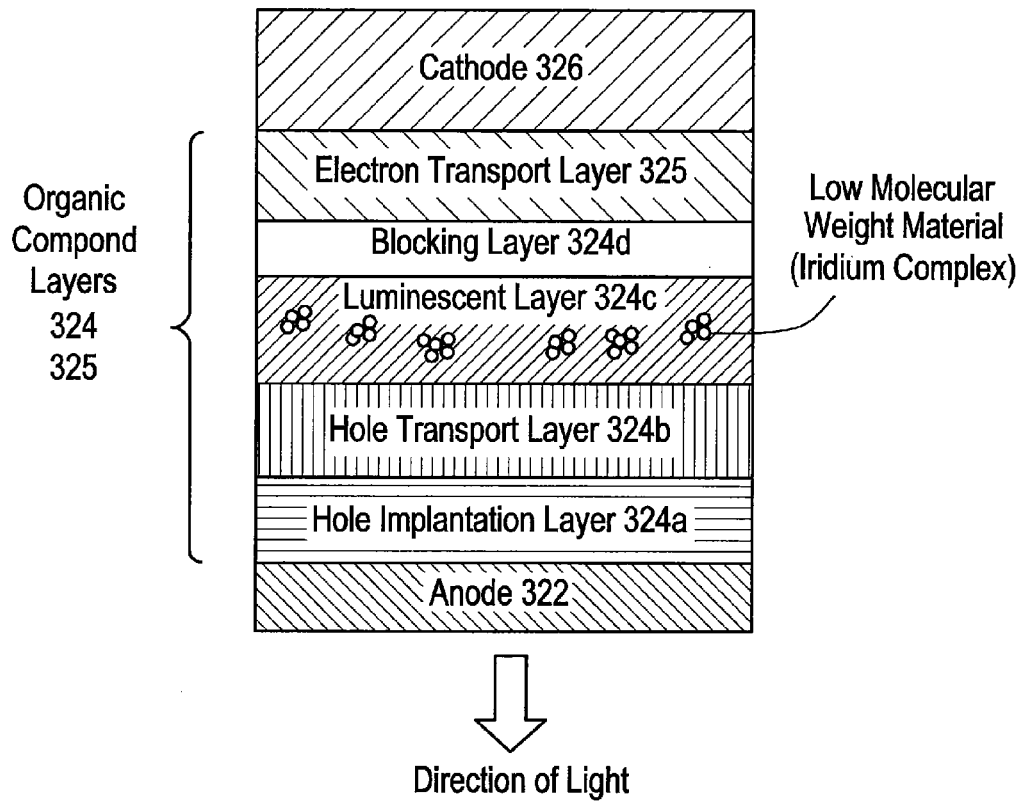
FIGS. 5A and 5B are diagram showing a configuration of an organic compound layer.

Next, a cathode 326 is formed by a vapor deposition method (FIG. 4B). As a material which is to be the cathode 326, in addition to Mg—Ag alloy and Al—Li alloy, a film in which elements belonging to I or II group of the periodic table are used is formed by a co-vapor deposition method and can be used. It should be noted that it is preferable that the film thickness of the cathode 326 is in the range from 80 to 200 nm.

As described above, as shown in FIG. 5, a luminescent element consisted of the anode 322, the organic compound layers 324 and 325, and the cathode 326 can be completed.

As a luminescence process of the above-described luminescent element, the following two processes can be considered. As the first luminescent process, a process in which the host material is excited by recombining the electron implanted into the luminescent layer and the hole on the host material, in turn the guest material is excited by this excitation energy moving to the guest material, and finally, the luminescence is generated at the time when this guest material returns to the ground state is considered. In order that this first luminescent process is efficiently occurred, it is required that the excitation energy difference between the host material and the guest material is small. As the second luminescent process, the guest material is excited by directly recombining the electron implanted into the luminescent layer and the hole on the guest material, and the luminescence is occurred at the time when this guest material returns to the ground state. In order that this second luminescent process is efficiently occurred, it is required that the guest material is easily traps both the electron and hole carriers.

Either of the two processes described above becomes dominant depending upon the diameter of the particle, the density of the particle in the host material, the distribution and the like. In any case, if these are the embodiment of a luminescent layer according to the present invention, the EL luminescence efficiency is certainly more improved.

Moreover, in FIG. 5B, the case where all of the organic compound layers are formed by methods indicated in the embodiment of the present invention is indicated below. It should be noted that in FIG. 5B, as for the portions corresponding to the portions in FIG. 3 and FIG. 4, the same reference numerals are used. Also here, a procedure in which an organic compound layer of green color is formed will be described below.

Figure 5B:
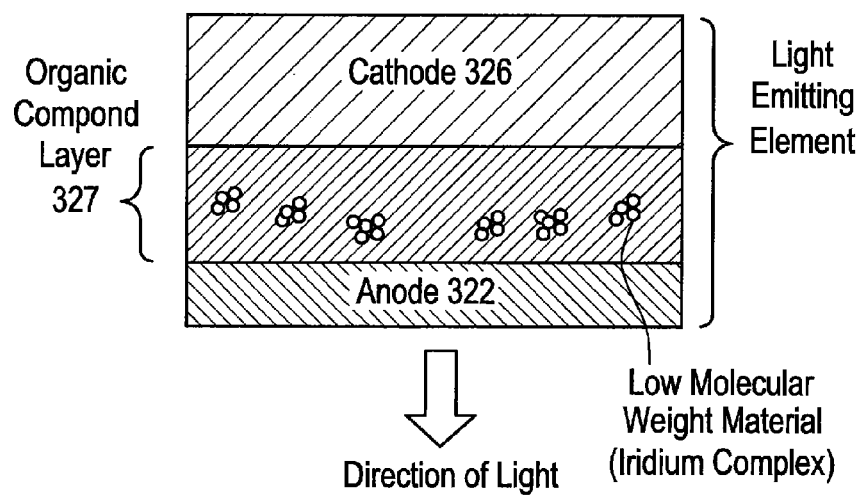

In FIG. 5B, a luminescent element that only an organic compound layer 327 is provided on the anode 322, and the cathode 326 is provided on the organic compound 327 is shown. In this case, the composition that iridium complex of several wt % is dispersed in the liquid in which 2-(4-biphenyl)-5-(4-tert-butylphenyl)-1,3,4-oxadiazole (PBD), poly (N-vinylcarbazole) (PVK) and toluene are mixed, may be used. It should be noted that PBD is soluble in toluene, PVK is also soluble in toluene. As shown in FIG. 3E, this composition is spread from the spreading nozzle, an organic compound layer is formed in a film thickness of about 100 nm, a cathode 327 may be subsequently formed by a vapor deposition method. It should be noted that in FIG. 5B, in the uniform amorphous thin film of the host material, the particles consisted of the guest material molecules are scattered.

Figure 4C:
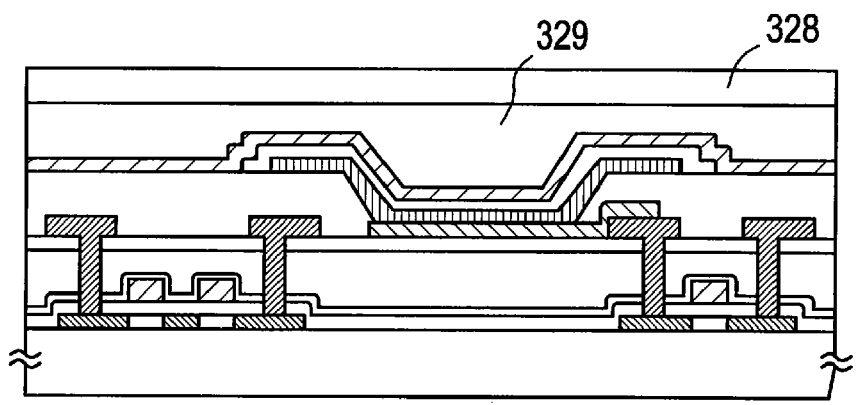

Next, as shown in FIG. 4C, a luminescent element is sealed with a cover member 328 or the like, and encapsulated into the space 329. As a result of this, the luminescent element can be shut out, the invasion of the materials promoting the deterioration of the organic compound layers such as water and oxygen from the exterior can be prevented.

It should be noted that as a material for constituting the cover member 328, in addition to glass substrate and quarts substrate, a plastic substrate consisted of FRP (Fiberglass-Reinforced Plastics), PVF (polyvinyl fluoride), Mylar, polyester, acryl or the like can be used.

Example 2

An example is shown in Example 1 of using an iridium complex, a low molecular weight material, as an organic compound, but it is also possible to use high molecular weight materials in light emitting layers, as shown below Note that, except for the organic compound layer, the structure in Example 2 is identical to that of Example 1, and for simplicity a detailed explanation of the identical portions is omitted here. In addition, the same reference numerals in FIGS. 3A to 4C are used in this explanation for portions that are identical to those of Example 1.

Processing is first performed in accordance with Example 1 until immediately before formation of the organic compound layer.

Next, a hole injecting layer 524 is formed on the anode 322 by the method shown in the embodiment. A composition in which a material referred to as PEDOT (poly(3,4-ethylene dioxythiophene)) is dissolved by polystyrene sulfonic acid (referred to as PSS) and water is sprayed from a spray nozzle (not shown in the figures), forming an organic compound layer (the hole injecting layer 524) having a film thickness of 25 to 40 nm. Note that this composition is a liquid in which PEDOT is dissolved in polystyrene sulfonic acid.

A light emitting layer 525 is formed next on the hole injecting layer 524 by the method shown in the embodiment.

It is possible to use the material referred to as PPV, poly(1, 4-phenylenevinylene), as the light emitting layer. Its molecular formula is shown below.

[Chem 2]

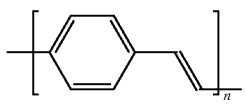

A composition in which PPV is dispersed in toluene is sprayed from a spray nozzle (not shown in the figures), forming an organic compound layer (the light emitting layer 525) at a film thickness of 70 nm. Note that PPV is not soluble in toluene, and that this composition is a liquid in which PPV is dispersed within toluene. Further, the composition is suitably selected in Example 2 so that the hole injecting layer does not dissolve when forming the light emitting layer.

Figure 6:
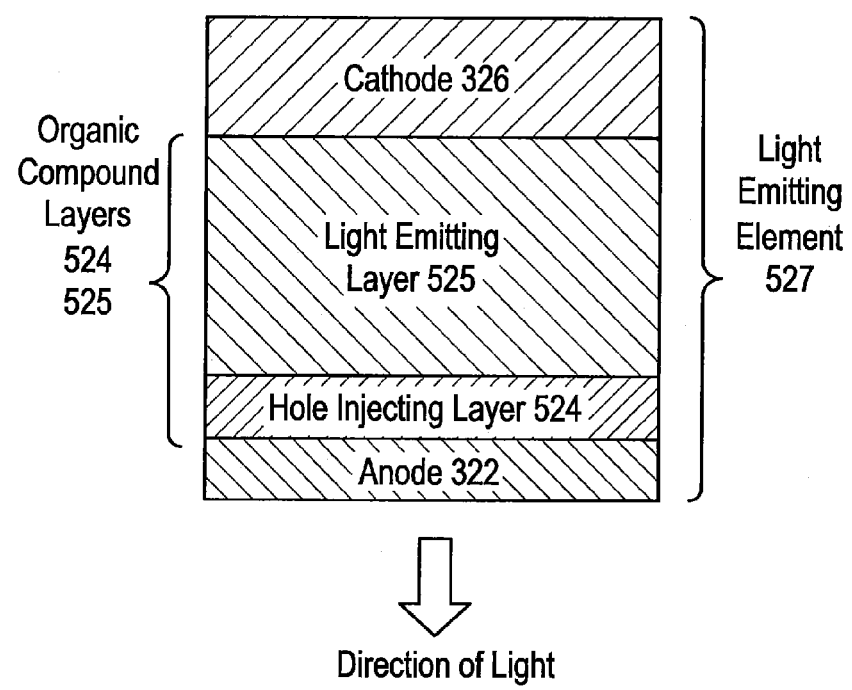
FIG. 6 is a diagram showing a configuration of an organic compound layer.

Subsequent processing, such as the formation of the cathode 326, may be performed in accordance with Example 1. A light emitting element 527 composed of the anode 322, the organic compound layers 524 and 525, and the cathode 326 can thus be completed as shown in FIG. 6. The color of light emitted by PPV is green.

With a conventional method, typically an application method, an organic compound material having high solubility is preferably used. An organic compound material referred to as RO-PPV (2,5-dialkoxy-1,4-phenylene vinylene), in which an alkoxy substituent is introduced in order to increase solubility, is used. The color purity therefore drops, and in addition, the color of light emission changes. The color of light emitted by RO-PPV becomes orange.

Further, it is possible to use a material referred to as PNV, poly(1,4-naphthalenevinylene) as a substitute for PPV. Its molecular formula is shown below.

[Chem 3]

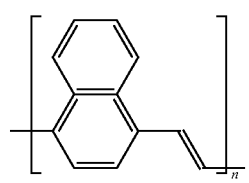

Further, it is also possible to use a material referred to as phenyl-PPV, poly(2-phenyl-1,4-phenylene vinylene). The molecular formula of phenyl-PPV is shown below.

[Chem 4]

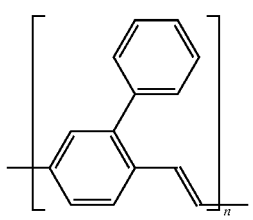

It is also possible to use a material referred to as PT, polythiophene. Its molecular formula is shown below.

[Chem 5]

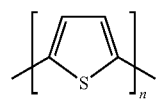

Furthermore, a material referred to as PPT, poly(3-phenylthiophene) can also be used. The molecular formula of PPT is shown below.

[Chem 6]

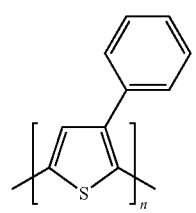

In addition, a material referred to as PPP, poly(1,4-phenylene) can also be used. Its molecular formula is shown below.

[Chem 7]

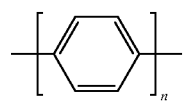

Further, it is also possible to use a material referred to as PF, poly(2,7-fluorene). The molecular formula of PF is shown below.

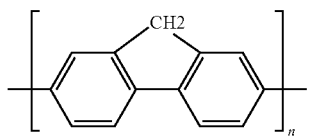

[Chem 8]

Two, three, or more of the aforementioned materials may also be used in combination.

Note that the above materials are only examples, and that there are no limitations placed on the present invention by these materials. Furthermore, the above materials are not soluble in toluene or in alcohols.

Example 3

An example of using a low molecular weight iridium complex as an organic compound is shown in Example 1. However, in the present invention, it is also possible to use other molecular materials in light emitting layers, as shown below.

It is possible to use a material referred to as quinacridon as a substitute for the iridium complex of Example 1. The molecular formula of quinacridon is shown below.

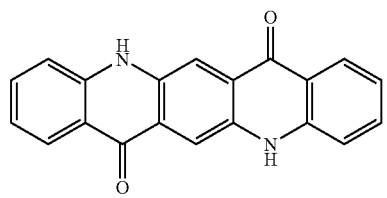

[Chem 9]

Further, it is also possible to use a material referred to as BCP, basocuproin, as a substitute for the iridium complex of Example 1. Its molecular formula is shown below.

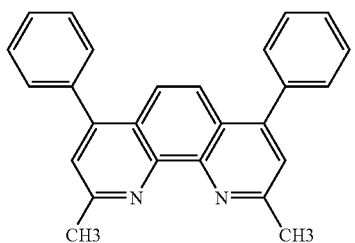

[Chem 10]

Furthermore, the aforementioned materials may also be used in combination of two, three, or more.

Note that the above materials are not soluble in toluene or in alcohols.

Example 4

Referring to FIG. 7, the external appearance of a light emitting device of the present invention will be described in Example 4.

Figure 7A:
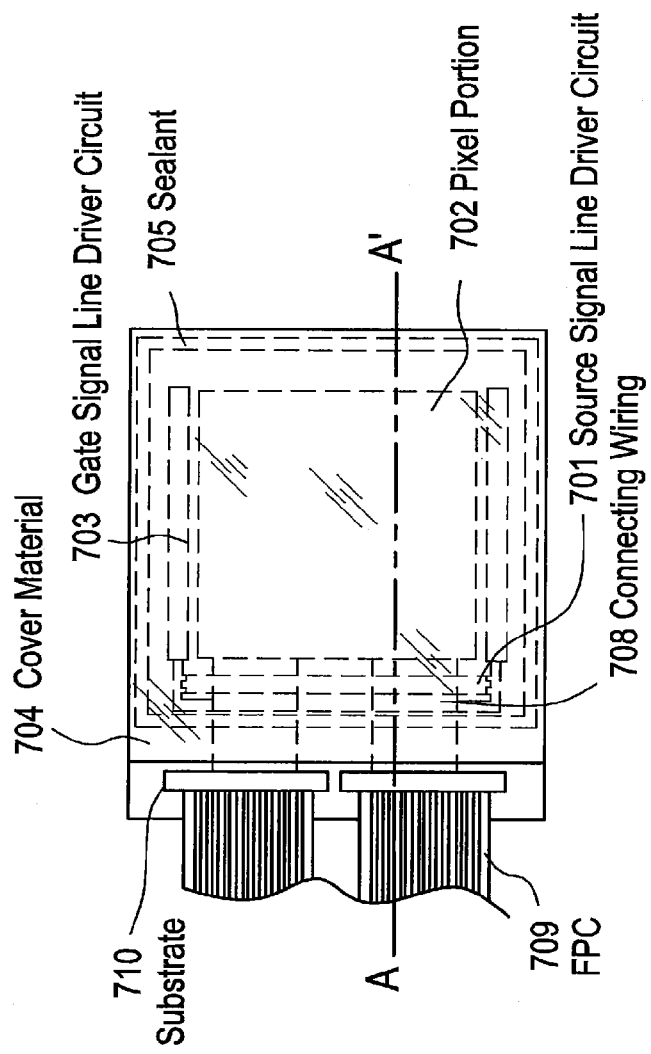
FIGS. 7A and 7B are outline view showing an EL module.
Figure 7B:
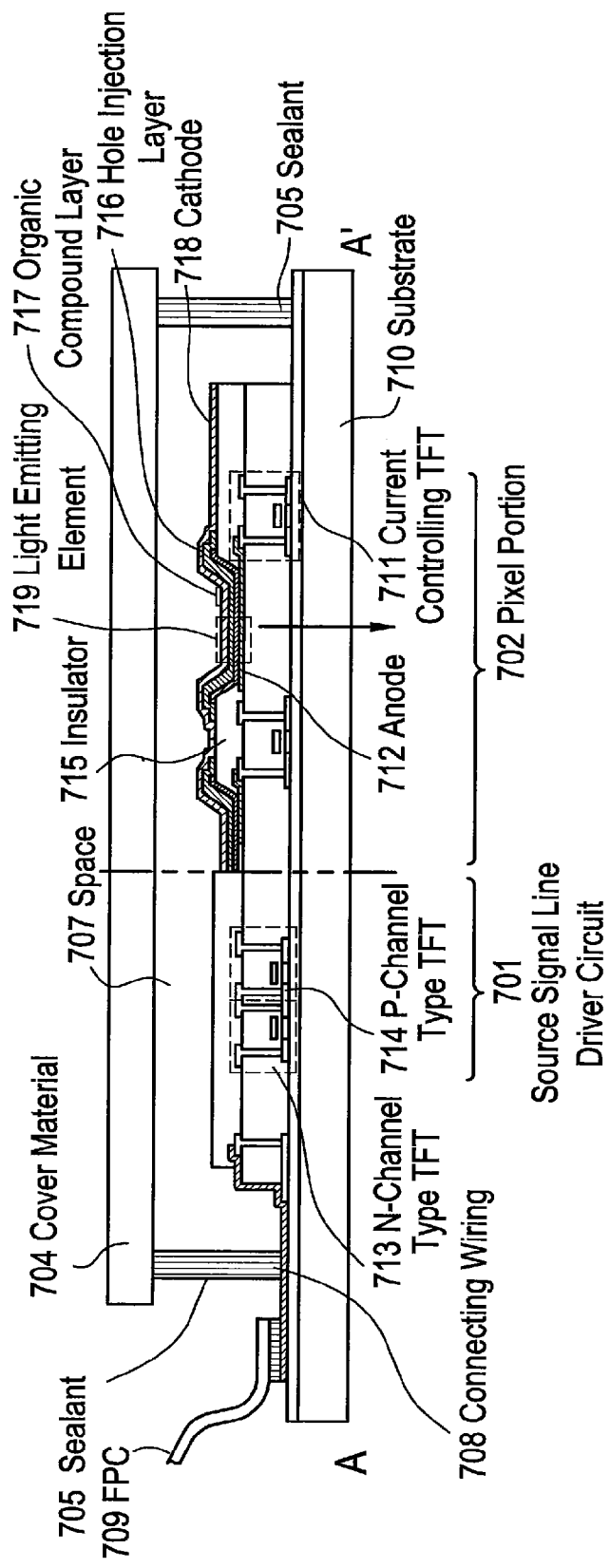

FIG. 7A is a top view of the light emitting device, and FIG. 7B is a sectional view taken on line A-A' of FIG. 7A. Reference number 701 represents a source signal line driver circuit, which is shown by a dotted line; 702, a pixel portion; 703, a gate signal line driver circuit; 710, a substrate; 704, a cover material; and 705, a sealant. A space 707 is surrounded by the substrate 710, the cover material 704, and the sealant 705.

Reference number 708 represents for transmitting signals inputted to the source signal line driver circuit 701 and the gate signal line driver circuit 703. The connecting wiring 708 receives video signals or clock signals from a flexible print circuit (FPC) 709, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 7B. The driver circuits and the pixel portion are formed on the substrate 710, but the source signal line driver circuit 701 as one of the driver circuits and the pixel portion 702 are shown in FIG. 7B.

In the source signal line driver circuit 701, a CMOS circuit wherein an n-channel type TFT 713 and a p-channel type TFT 714 are combined is formed. The TFTs constituting the driver circuit may be composed of known CMOS circuits, PMOS circuits or NMOS circuits. In Example 4, a driver-integrated type, wherein the driver circuit is formed on the substrate, is illustrated, but the driver-integrated type may not necessarily be adopted. The driver may be fitted not to the substrate but to the outside.

The pixel portion 702 is composed of plural pixels including a current-controlling TFT 711 and an anode 712 electrically connected to the drain of the TFT 711.

In the anode 712, slits are made. On the both sides of the anode 712, insulators 715 are formed, and an organic compound layer 717 composed of a hole injection layer 716, a hole generating layer, a hole transport layer, a light emitting layer and an electron transport layer is formed. Furthermore, a cathode 718 is formed on the insulators 715 and the organic compound layer 717. In this way, a light emitting element 719 composed of the anode, the organic compound layer and the cathode is formed.

The cathode 718 also functions as a wiring common to all of the pixels. And the cathode 718 is electrically connected through the interconnection line 708 to the FPC 709.

In order to confine the light emitting element 719 formed on the substrate 710 airtightly, the cover material 704 is adhered to the substrate 710 with the sealant 705. A spacer made of a resin film may be set up to keep a given interval between the cover material 704 and the light emitting element 719. An inert gas such as nitrogen is filled into the space 707 inside the sealant 705. As the sealant 705, an epoxy resin is preferably used. The sealant 705 is desirably made of a material through which water content or oxygen is transmitted as slightly as possible. Furthermore, it is allowable to incorporate a material having moisture absorption effect or a material having anti-oxidation effect into the space 707.

In Example 4, as the material making the cover material 704, there may be used a glass substrate, a quartz substrate, or a plastic substrate made of fiber glass-reinforced plastic (FRP), polyvinyl fluoride (PVF), mylar, polyester or polyacrylic resin.

After the adhesion of the cover material 704 to the substrate 710 with the sealant 705, a sealant is applied so as to cover the side faces (exposure faces).

As described above, the light emitting element is airtightly put into the space 707, so that the light emitting element can be completely shut out from the outside and materials promoting deterioration of the organic compound layer, such as water content and oxygen, can be prevented from invading this layer from the outside. Consequently, the light emitting device can be made highly reliable.

When the light emitting element formed by any one of the structures of Examples 1 to 3 is airtightly confined inside a space to manufacture a light emitting device, the structure of Example 4 may be freely combined with the structure.

Example 5

Figure 8A:
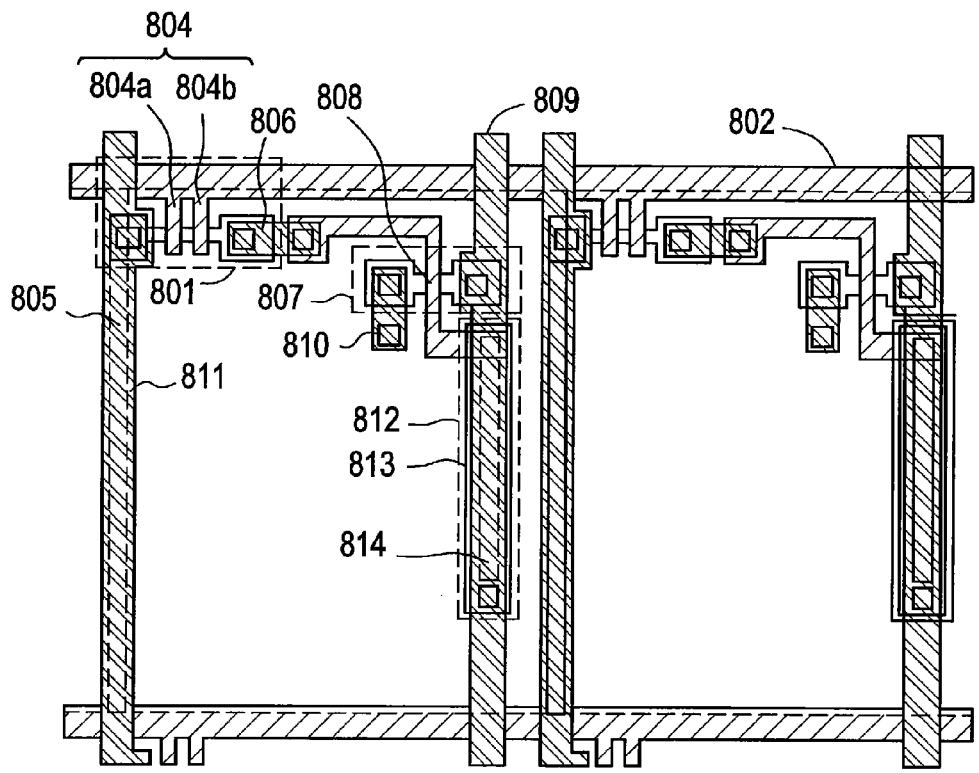
FIGS. 8A and 8B are diagram showing a top view of a pixel.
Figure 8B:
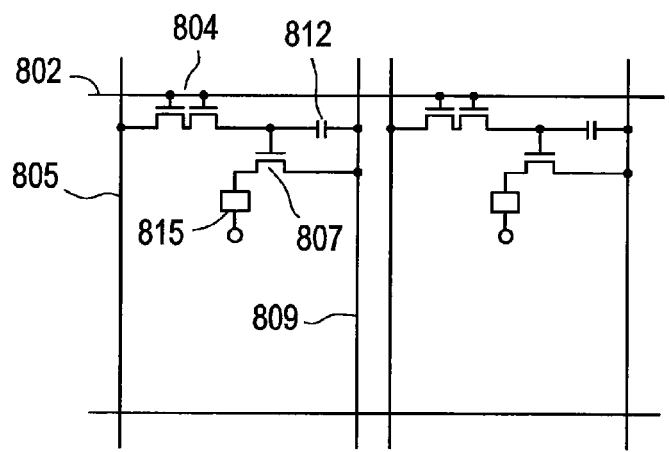

A light emitting device of the present invention can be made up to a pixel portion illustrated in FIG. 8A. The circuit configuration of the device illustrated in FIG. 8A is illustrated in FIG. 8B.

In FIG. 8A, reference number 801 represents a switching TFT, which is an n-channel type TFT. A wiring 802 is a gate wiring for connecting gate electrodes 804 (804*a* and 804*b*) of the switching TFT 801 electrically.

In Example 5, a double-gate structure, wherein two channel-formed areas are laid out, is adopted. However, a single-gate structure, wherein a single channel-formed area is formed, or a triple-gate structure, wherein three channel-formed areas are formed, may be adopted.

The source of the switching TFT 801 is connected to a source wiring 805, and the drain thereof is connected to a drain wiring 806. The drain wiring 806 is electrically connected to a gate electrode 808 of the current-controlling TFT 807. The current-controlling TFT 807 is made up of a p-channel type TFT. In Example 5, a single-gate structure is adopted. However, a double-gate structure or a triple-gate structure may be adopted.

In the Example 5, the switching TFT 801 is made up of an n-channel type TFT, and the current-controlling TFT 807 is made up of a p-channel type TFT. However, the switching TFT 801 may be made up of a p-channel type TFT, and the current-controlling TFT 807 may be made up of an n-channel type TFT. Both of them may be made up of n-channel type TFTs or p-channel type TFTs.

The source of the current-controlling TFT 807 is electrically connected to a current-supplying line 809, and the drain thereof is electrically connected to a drain wiring 810. The drain wiring 810 is electrically connected to an electrode (anode) 811 shown by a dotted line. By forming an organic compound layer and an electrode (cathode) on the electrode (anode) 811, a light emitting element 815 illustrated in FIG. 8B can be formed.

In a region 812, a retention capacitor (condenser) is formed. The condenser 812 is composed of a semiconductor film 813 electrically connected to the current-supplying line 809, an insulating film (not illustrated) as the same layer which constitutes the gate insulating film, and a capacitor electrode 814 electrically connected to the gate electrode 808. A capacitor composed of the capacitor electrode 814, the same layer (not illustrated) that constitutes an interlayer dielectric, and the current-supplying line 809 may be used as a retention capacitor.

The structure of the pixel portion described in Example 5 may be combined instead of the pixel portion described in Example 1.

In Example 5, the pixel portion and the TFT of the driver circuit (n-channel type TFT and the p-channel type TFT) to be provided at the periphery of the pixel portion may be formed simultaneously on the same substrate. In addition, the light emitting element electrically connected to the TFT may formed in the pixel portion to manufacture the element substrate.

Example 6

An example of light from a light emitting element being emitted in a downward direction through a substrate is shown in Example 1. In Example 6, however, an example of light emitted from a light emitting element in an upward direction is shown in FIGS. 9A and 9B.

Note that although a glass substrate is used as a substrate 600 in Example 6, quartz substrates, silicon substrates, metallic substrates, and ceramic substrates may also be used.

Figure 9A:
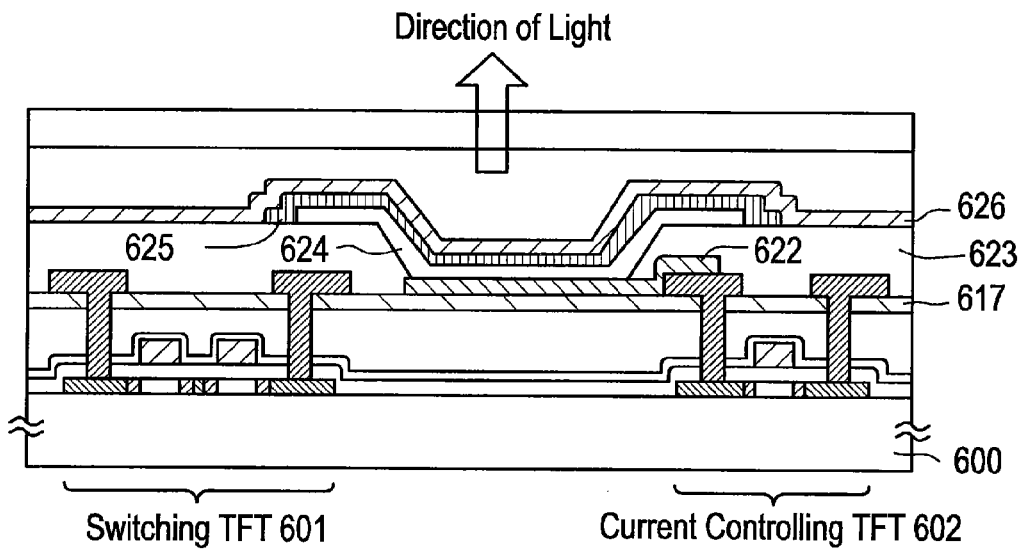
FIGS. 9A and 9B are diagram showing a luminescent device.

Active layers of each TFT are prepared with at least a channel forming region, a source region, and a drain region in FIG. 9A. Further, the active layers of each TFT are covered by a gate insulating film, and a gate electrode is formed so as to overlap with the channel forming region through the gate insulating film. An interlayer insulating film is formed covering the gate electrode, and electrodes that are electrically connected to the source region or the drain region of each of the TFTs are formed on the interlayer insulating film. A cathode 622 that is electrically connected to a current control TFT 602, an n-channel TFT, is then formed. Further, an insulating layer 623 having an opening portion is formed covering an edge portion of the cathode 622 and having a tapered shape border. An organic compound layer composed of an organic layer 624 and a hole injecting layer 625 is formed on the cathode 622, and an anode 626 is formed on the organic compound layer, thus forming a light emitting element. Note that the light emitting element is sealed by a covering material while maintaining a space.

Figure 9B:
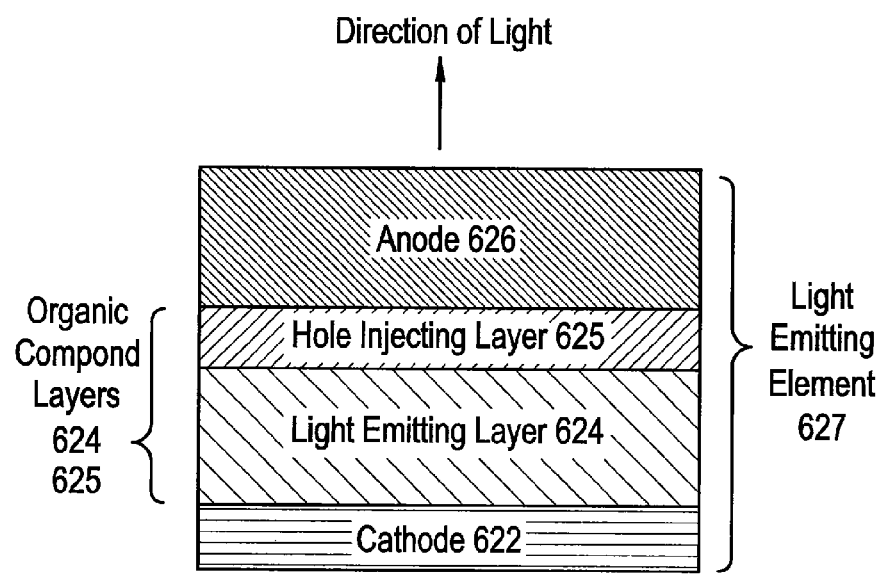

In Example 6, the organic compound layers 624 and 625 shown in FIG. 9B are formed by the method disclosed in the embodiment.

First, in accordance with Example 1, the cathode 622 is formed after forming the electrodes, which are electrically connected to the source region or the drain region of each of the TFTs; on the interlayer insulating film. It is preferable to form the cathode using Al or an Al—Li aluminum alloy, which have small work functions. A transparent conductive film is used in the anode, and it is possible to use materials such as a compound of indium oxide and tin oxide (referred to as ITO), a compound of indium oxide and zinc oxide, tin oxide, and zinc oxide for the transparent conductive film.

The insulating layer 623 having an opening portion is formed next covering the edge portion of the cathode 622 and having a tapered shape border, after which the light emitting layer 624 is formed on the cathode 622 by the method shown in the embodiment. A composition, in which the material referred to as PPV is dispersed in toluene, is then sprayed from a spray nozzle (not shown in the figures), forming an organic compound layer (the light emitting layer 624) at a film thickness of 70 nm. Note that PPV is not soluble in toluene, and this composition is a liquid in which PPV is dispersed within toluene.

Next, a composition having copper phthalocyanine (Cu—Pc) dispersed in toluene is sprayed from a spray nozzle (not shown in the figures), forming an organic compound layer (the hole injecting layer 625) at a film thickness of 20 nm. Note that Cu—Pc is not soluble in toluene, and this composition is a liquid in which Cu—Pc is dispersed within toluene.

The anode 626 is formed next, and a light emitting element 627 composed of the anode 626, the organic compound layers 624 and 625, and the cathode 622 can thus be completed.

A light emitting device having a light emitting element with a structure in which light generated by the organic compound layer is extracted in the direction of arrows shown in FIGS. 9A and 9B can be made in accordance with Example 6.

It is possible to use the low molecular weight materials shown in Example 2, and the high molecular weight materials shown in Example 3, for Example 6.

Example 7

In the present Example, an example of a luminescent element in which the light is outgoing upward in a different laminated structure from Example 6 is indicated.

First, according to Example 1, after an electrode for electrically connecting to the source region or drain region of the respective TFT on the interlayer insulating film, an anode is formed.

As an anode, it may be formed by a metal material having a larger work function, for example, a metal film containing Pt, Ni, Cr, W, Zn, Sn, In and the like.

Subsequently, a layer containing an organic compound is formed on an anode. The layer containing an organic compound may be formed by a vapor deposition method using resistance heating or a coat method (spin coat method, ink jet method or the like). Moreover, a layer containing an organic compound may be formed by the methods indicated in the embodiments of the present invention.

Subsequently, a thin film consisted of a compound containing a metal material having a small work function, for example, Li, Al, Ag, Mg, Cs, or Ca is formed on the layer containing an organic compound. It is desirable that this thin film is made in the range of the film thickness (about 2-20 nm) that the luminescence from the layer containing an organic compound transmits the film. In the present Example, after using the device shown in FIG. 1 and FIG. 2, a metal compound in a powdered shape is dispersed in liquid (however, liquid not dissolving and not denaturing the organic compound) and spread uniformly, a thin metal compound film is formed by vaporizing only liquid by burning. Moreover, in the present Example, although an example in which a thin metal compound film is formed by spreading has been indicated, it is not particularly limited to that, coat methods using spin coat or ink jet or the like may be used.

Moreover, in the above-described constitutions, in order to control the formation position of the above-mentioned thin metal compound film, a mask is arranged, and a thin metal compound film may be formed by making it pass through the opening of the mask. Or the portions of the thin metal compound film which are not required may be selectively removed by oxygen plasma processing or the like.

Subsequently, an electrically conductive transparent film (ITO (indium oxide-tin oxide alloy), indium oxide-zinc oxide alloy ($In_2O_3$—ZnO), zinc oxide (ZnO) or the like) is formed on the thin metal compound film by a sputtering method. In the present example, a laminated layer of a thin metal compound layer and an electrically conductive transparent layer is functioned as a cathode.

By the processes described above, a luminescent element consisted of an anode, a layer containing an organic compound, and a cathode can be completed. According to the present example, a luminescent device can be made, which has a luminescent element having a structure in which the light generated in an organic compound layer transmits the cathode and is taken out. Moreover, the present Example can be freely combined with any one of Examples 1 through 5.

For example, instead of a cathode by a vapor deposition method indicated in Example 1, a cathode or one portion of the cathode may be formed by coat method (spin coat, ink jet, spray or the like). A luminescent device can be completed by the process which is cheap and simplified according to the present invention.

Example 8

A light emitting device using a light emitting element is self-luminous and therefore is superior in visibility in bright surroundings compared to liquid crystal display devices and has wider viewing angle. Accordingly, it can be used for display portions of various electric equipments.

Given as examples of electric equipment employing a light emitting device formed by the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device (specifically, a device equipped with a display device which can reproduce a recording medium such as a digital versatile disk (DVD), and can display the image). The light emitting device having a light emitting element is desirable particularly for a portable information terminal since its screen is often viewed obliquely and is required to have a wide viewing angle. Specific examples of the electric equipment are shown in FIGS. 10A to 10H.

Figure 10A:
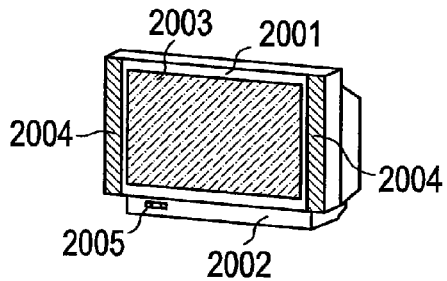
FIGS. 10A to 10H are diagram showing one example of an electronic device.

FIG. 10A shows a display device, which comprises a casing 2001, a supporting base 2002, a display portion 2003, speaker portions 2004, a video input terminal 2005, etc. The light emitting device formed by the present invention is applied can be used for the display portion 2003. The light emitting device having a light emitting element is self-luminous and does not need a backlight, so that it can make a thinner display portion than liquid display devices can. The term display device includes every display device for displaying information such as one for a personal computer, one for receiving TV broadcasting, and one for advertisement. In addition, the display shown in FIG. 10A is small-medium type or large type, for example, screen of the display sized 5 to 20 inches. Moreover, it is preferable to mass-produce by executing a multiple pattern using a substrate sized 1×1 m to form such sized display section.

Figure 10B:
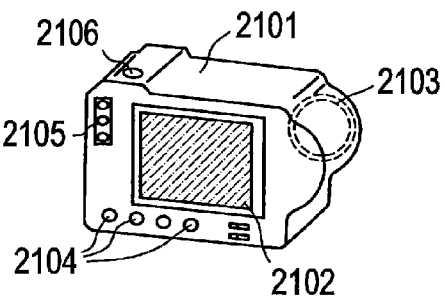

FIG. 10B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102.

Figure 10C:
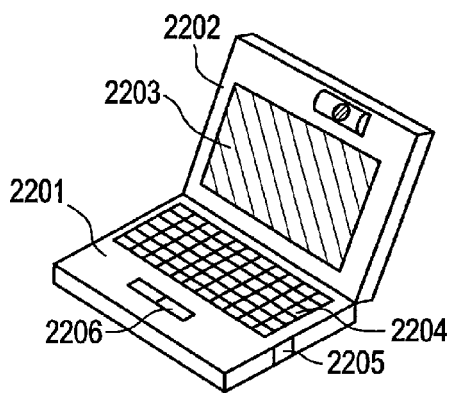

FIG. 10C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203.

Figure 10D:
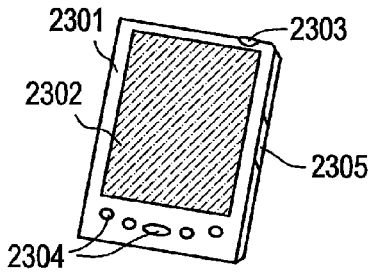

FIG. 10D shows a mobile computer, which comprises a main body 2301, a display portion 2302, a switch 2303, operation keys 2304, an infrared ray port 2305, etc. The light emitting device formed by the present invention is applied can be used for the display portion 2302.

Figure 10F:
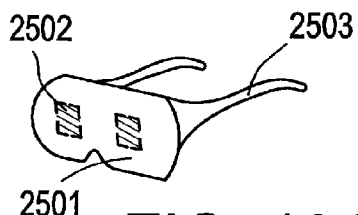
Figure 10E:
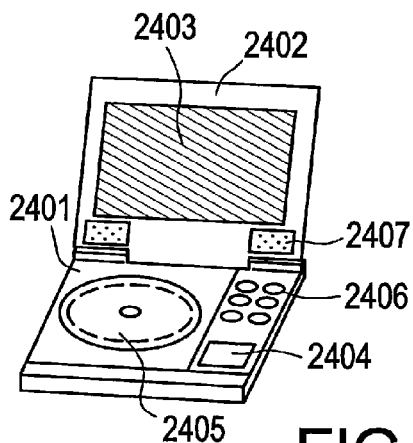

FIG. 10E shows a portable image reproducing device equipped with a recording medium (a DVD player, to be specific). The device comprises a main body 2401, a casing 2402, a display portion A 2403, a display portion B 2404, a recording medium (DVD) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404. The term image reproducing device equipped with a recording medium includes video game machines.

FIG. 10F shows a goggle type display (head mounted display), which comprises a main body 2501, display portions 2502, and arm portions 2503. The light emitting device formed by the present invention is applied can be used for the display portions 2502.

Figure 10G:
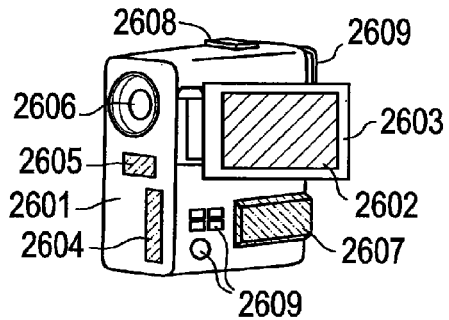

FIG. 10G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, etc. The light emitting device formed by the present invention is applied can be used for the display portion 2602.

Figure 10H:
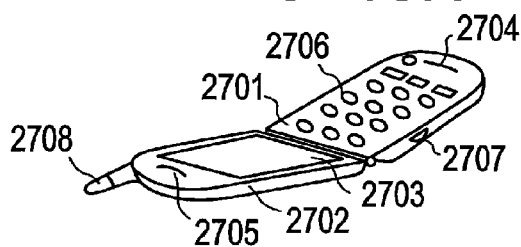

FIG. 10H shows a cellular phone, which comprises a main body 2701, a casing 2702, a display portion 2703, an audio input portion 2704, an audio output portion 2705, operation keys 2706, an external connection port 2707, an antenna 2708, etc. The light emitting device formed by the present invention is applied can be used for the display portion 2703. If the display portion 2703 displays white characters on a black background, power consumption of the cellular phone can be reduced.

If the luminance of light emitted from organic materials is increased in future, the light emitting device having a light emitting element can be used also in a front or rear projector in which light bearing outputted image information is magnified by a lens or the like to be projected on a screen.

The electric equipment given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore, it is desirable to display information such that as small portions as possible emits light. Accordingly, if the light emitting device is used for a display portion that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electric equipment of every field can employ the device. The electric equipments in this example may use the light emitting device formed in Examples 1 to 6 to the display portion thereof.

The present invention is the method capable of forming a film with any state of an organic compound material in liquid, and particularly, it is characterized by the fact that an organic compound film with an excellent quality is formed using an organic compound material which is not easily dissolved. Therefore, according to the present invention, a variety of organic compound materials are capable of being used, and the variation of the luminescent colors of the luminescent device can be increased.

Moreover, in the present invention, since the formation of the film is performed by repeating the spreading of the liquid containing the organic compound, the formation of the film is capable of being performed in a comparatively short time period. The method of manufacturing liquid containing organic compound used for spreading can be simplified. Moreover, according to the present invention, in the case where the film of the desired pattern is formed, it is done using a mask, and further preferably, the film formation is performed through making it pass through the opening of the mask by controlling the electric field.

What is claimed is:

1. A method for manufacturing an electroluminescent device comprising:
    setting a substrate in a chamber;
    forming an anode over the substrate;
    forming an electroluminescence layer over the anode by repeatedly spreading a plurality of droplets of a first composition which flows from a nozzle; and
    forming a cathode over the electroluminescence layer,
    wherein the plurality of droplets of the first composition are discharged so that the plurality of droplets of the first composition are spread from the nozzle in different directions at one time,
    wherein a fixed skirt is provided inside of and in contact with the chamber and the fixed skirt is provided around the nozzle,
    wherein a heated nitrogen gas is discharged into an inner side of the fixed skirt to hit the plurality of droplets of the first composition,
    wherein the plurality of droplets of the first composition comprises an organic compound, and
    wherein the substrate is heated by a heater provided on a substrate stage.

2. The method for manufacturing the electroluminescent device according to claim 1, wherein the substrate is a glass substrate.

3. The method for manufacturing the electroluminescent device according to claim 1, wherein the plurality of droplets of the first composition comprises at least one selected from alcohols, toluene and water.

4. The method for manufacturing the electroluminescent device according to claim 1, wherein a switching element is provided on the substrate.

5. The method for manufacturing the electroluminescent device according to claim 1, wherein a solvent of the plurality of droplets of the first composition is evaporated by heating when the plurality of droplets of the first composition are discharged from the nozzle.

6. The method for manufacturing the electroluminescent device according to claim 1, wherein the chamber includes an evacuation means.

7. The method for manufacturing the electroluminescent device according to claim 1, wherein a thickness of the electroluminescence layer is in the range from 1 nm to 1 μm.

8. The method for manufacturing the electroluminescent device according to claim 1, wherein the fixed skirt is provided so as not to be in contact with an ejection outlet of the heated nitrogen gas.

9. A method for manufacturing an electroluminescent device comprising:
    setting a substrate in a chamber;
    forming an anode over the substrate;
    forming an electroluminescence layer over the anode by repeatedly spreading a plurality of droplets of a first composition which flows from a nozzle; and
    forming a cathode over the electroluminescence layer,
    wherein a first mask is set between the nozzle and the substrate and the electroluminescence layer is formed by making the plurality of droplets of the first composition pass through an opening portion of the first mask, wherein the plurality of droplets of the first composition are discharged so that the plurality of droplets of the first composition are spread from the nozzle in different directions at one time, wherein a fixed skirt is provided inside of and in contact with the chamber and the fixed skirt is provided around the nozzle, wherein a heated nitrogen gas is discharged into an inner side of the fixed skirt to hit the plurality of droplets of the first composition, wherein the plurality of droplets of the first composition comprises an organic compound, and wherein the substrate is heated by a heater provided on a substrate stage.

10. The method for manufacturing the electroluminescent device according to claim 9, wherein the substrate is a glass substrate.

11. The method for manufacturing the electroluminescent device according to claim 9, wherein the plurality of droplets of the first composition comprises at least one selected from alcohols, toluene and water.

12. The method for manufacturing the electroluminescent device according to claim 9, wherein a switching element is provided on the substrate.

13. The method for manufacturing the electroluminescent device according to claim 9, wherein a solvent of the plurality of droplets of the first composition is evaporated by heating when the plurality of droplets of the first composition are discharged from the nozzle.

14. The method for manufacturing the electroluminescent device according to claim 9, wherein the chamber includes an evacuation means.

15. The method for manufacturing the electroluminescent device according to claim 9, wherein a thickness of the electroluminescence layer is in the range from 1 nm to 1 µm.

16. The method for manufacturing the electroluminescent device according to claim 9, wherein the fixed skirt is provided so as not to be in contact with an ejection outlet of the heated nitrogen gas.

17. A method for manufacturing an electroluminescent device comprising:
   setting a substrate in a chamber;
   forming an anode over the substrate;
   forming an electroluminescence layer over the anode by repeatedly spreading a plurality of droplets of a first composition which flows from a nozzle; and
   forming a cathode over the electroluminescence layer,
   wherein the plurality of droplets of the first composition is liquid having fluidity, and organic compound aggregates are dispersed as colloidal particulates in the liquid,
   wherein the plurality of droplets of the first composition are discharged so that the plurality of droplets of the first composition are spread from the nozzle in different directions at one time,
   wherein a fixed skirt is provided inside of and in contact with the chamber and the fixed skirt is provided around the nozzle,
   wherein a heated nitrogen gas is discharged into an inner side of the fixed skirt to hit the plurality of droplets of the first composition,
   wherein the plurality of droplets of the first composition comprises an organic compound, and
   wherein the substrate is heated by a heater provided on a substrate stage.

18. The method for manufacturing the electroluminescent device according to claim 17, wherein the substrate is a glass substrate.

19. The method for manufacturing the electroluminescent device according to claim 17, wherein the plurality of droplets of the first composition comprises at least one selected from alcohols, toluene and water.

20. The method for manufacturing the electroluminescent device according to claim 17, wherein a switching element is provided on the substrate.

21. The method for manufacturing the electroluminescent device according to claim 17, wherein a solvent of the plurality of droplets of the first composition is evaporated by heating when the plurality of droplets of the first composition are discharged from the nozzle.

22. The method for manufacturing the electroluminescent device according to claim 17, wherein the chamber includes an evacuation means.

23. The method for manufacturing the electroluminescent device according to claim 17, wherein a thickness of the electroluminescence layer is in the range from 1 nm to 1 µm.

24. The method for manufacturing the electroluminescent device according to claim 17, wherein a material of the organic compound aggregates is one or more kinds selected from quinacridone, tris (2-phenylpyridine) iridium and bathocuproine.

25. The method for manufacturing the electroluminescent device according to claim 17, wherein a material of the organic compound aggregates is one or more kinds selected from poly (1,4-phenylenevinylene), poly (1,4-naphthalenevinylene), poly (2-phenyl-1,4-phenylenevinylene), polythiophene, poly (3-phenylthiophene), poly (1,4-phenylene) and poly (2,7-fluorene).

26. The method for manufacturing the electroluminescent device according to claim 17, wherein the fixed skirt is provided so as not to be in contact with an ejection outlet of the heated nitrogen gas.

27. A method for manufacturing an electroluminescent device comprising:
   setting a substrate in a chamber;
   forming an anode over the substrate;
   forming an electroluminescence layer over the anode by repeatedly spreading a plurality of droplets of a first composition which flows from a nozzle; and
   forming a cathode over the electroluminescence layer,
   wherein a first mask is set between the nozzle and the substrate and the electroluminescence layer is formed by making the plurality of droplets of the first composition pass through an opening portion of the first mask,
   wherein the plurality of droplets of the first composition is liquid having fluidity, and organic compound aggregates are dispersed as colloidal particulates in the liquid,
   wherein the plurality of droplets of the first composition are discharged so that the plurality of droplets of the first composition are spread from the nozzle in different directions at one time,
   wherein a fixed skirt is provided inside of and in contact with the chamber and the fixed skirt is provided around the nozzle,
   wherein a heated nitrogen gas is discharged into an inner side of the fixed skirt to hit the plurality of droplets of the first composition,
   wherein the plurality of droplets of the first composition comprises an organic compound, and
   wherein the substrate is heated by a heater provided on a substrate stage.

28. The method for manufacturing the electroluminescent device according to claim 27, wherein the substrate is a glass substrate.

29. The method for manufacturing the electroluminescent device according to claim 27, wherein the plurality of droplets of the first composition comprises at least one selected from alcohols, toluene and water.

30. The method for manufacturing the electroluminescent device according to claim 27, wherein a switching element is provided on the substrate.

31. The method for manufacturing the electroluminescent device according to claim 27, wherein a solvent of the plurality of droplets of the first composition is evaporated by heating when the plurality of droplets of the first composition are discharged from the nozzle.

32. The method for manufacturing the electroluminescent device according to claim 27, wherein the chamber includes an evacuation means.

33. The method for manufacturing the electroluminescent device according to claim 27, wherein a thickness of the electroluminescence layer is in the range from 1 nm to 1 μm.

34. The method for manufacturing the electroluminescent device according to claim 27, wherein a material of the organic compound aggregates is one or more kinds selected from quinacridone, tris (2-phenylpyridine) iridium and bathocuproine.

35. The method for manufacturing the electroluminescent device according to claim 27, wherein a material of the organic compound aggregates is one or more kinds selected from poly (1,4-phenylenevinylene), poly (1,4-naphthalenevinylene), poly (2-phenyl-1,4-phenylenevinylene), polythiophene, poly (3-phenylthiophene), poly (1,4-phenylene) and poly (2,7-fluorene).

36. The method for manufacturing the electroluminescent device according to claim 27, wherein the fixed skirt is provided so as not to be in contact with an ejection outlet of the heated nitrogen gas.

* * * * *